(12) United States Patent
Jang et al.

(10) Patent No.: US 12,132,148 B2
(45) Date of Patent: Oct. 29, 2024

(54) LIGHT EMITTING DEVICE FOR DISPLAY AND DISPLAY APPARATUS HAVING THE SAME

(71) Applicant: SEOUL VIOSYS CO., LTD., Ansan-si (KR)

(72) Inventors: Seong Kyu Jang, Ansan-si (KR); Chan Seob Shin, Ansan-si (KR); Seom Geun Lee, Ansan-si (KR); Ho Joon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 267 days.

(21) Appl. No.: 17/536,074

(22) Filed: Nov. 28, 2021

(65) Prior Publication Data

US 2022/0158031 A1 May 19, 2022

Related U.S. Application Data

(63) Continuation of application No. 16/815,823, filed on Mar. 11, 2020, now Pat. No. 11,211,528.
(Continued)

(51) Int. Cl.
*H01L 33/24* (2010.01)
*H01L 25/075* (2006.01)
(Continued)

(52) U.S. Cl.
CPC .......... *H01L 33/24* (2013.01); *H01L 25/0753* (2013.01); *H01L 33/62* (2013.01);
(Continued)

(58) Field of Classification Search
CPC ..... H01L 33/24; H01L 25/0753; H01L 33/62; H01L 25/0756; H01L 33/382;
(Continued)

(56) References Cited

U.S. PATENT DOCUMENTS 9,076,929 B2 7/2015 Katsuno et al.
10,686,099 B2 6/2020 Huppmann et al.
(Continued)

FOREIGN PATENT DOCUMENTS

JP H08-236812 9/1996
JP 2014-026975 2/2014
(Continued)

OTHER PUBLICATIONS

International Search Report dated Jun. 23, 2020 issued in PCT/KR2020/003451.
(Continued)

*Primary Examiner* — Victor A Mandala

(74) *Attorney, Agent, or Firm* — Oblon, McClelland, Maier & Neustadt, L.L.P.

(57) ABSTRACT

A method of fabricating a light emitting device for a display, the method including the steps of growing a first LED stack on a first growth substrate, the first LED stack including a first conductivity type semiconductor layer and a second conductivity type semiconductor layer, growing a second LED stack on a second growth substrate, the second LED stack including a first conductivity type semiconductor layer and a second conductivity type semiconductor layer, bonding the second LED stack to a first temporary substrate, removing the second growth substrate from the second LED stack, bonding the second LED stack to the first LED stack, and removing the first temporary substrate from the second LED stack.

19 Claims, 47 Drawing Sheets

Related U.S. Application Data

(60) Provisional application No. 62/817,704, filed on Mar. 13, 2019.

(51) Int. Cl.
*H01L 33/62* (2010.01)
*G02B 27/01* (2006.01)
*G06F 1/16* (2006.01)

(52) U.S. Cl.
CPC .. *G02B 27/0172* (2013.01); *G02B 2027/0178* (2013.01); *G06F 1/163* (2013.01)

(58) Field of Classification Search
CPC ..... H01L 27/15; H01L 33/0008; H01L 33/38; H01L 33/42; G02B 27/0172; G02B 2027/0178; G06F 1/163; G06F 1/1637
See application file for complete search history.

(56) References Cited

U.S. PATENT DOCUMENTS

| | | | |
|---|---|---|---|
| 11,296,060 | B2 | 4/2022 | Oh et al. |
| 2006/0027820 | A1 | 2/2006 | Cao |
| 2009/0272989 | A1* | 11/2009 | Shum ............... H01L 33/08 257/89 |
| 2011/0086486 | A1 | 4/2011 | Lee et al. |
| 2012/0146045 | A1 | 6/2012 | Sugiyama et al. |
| 2014/0026952 | A1 | 1/2014 | Kim et al. |
| 2014/0252382 | A1* | 9/2014 | Hashimoto ......... H01L 33/60 438/27 |
| 2014/0284633 | A1 | 9/2014 | Tsay et al. |
| 2016/0064439 | A1 | 3/2016 | Or-Bach et al. |
| 2017/0288093 | A1* | 10/2017 | Cha .................. H01L 33/382 |
| 2019/0164944 | A1* | 5/2019 | Chae ................. H01L 25/0756 |
| 2019/0165037 | A1* | 5/2019 | Chae ................. H01L 33/507 |
| 2019/0189596 | A1* | 6/2019 | Chae ................. H01L 33/50 |
| 2019/0189681 | A1* | 6/2019 | Chae ................. H01L 25/0756 |
| 2019/0198565 | A1* | 6/2019 | Lee .................. H01L 33/30 |
| 2019/0214373 | A1* | 7/2019 | Kim .................. H01L 33/22 |
| 2020/0058824 | A1* | 2/2020 | Jang ................. H01L 27/156 |
| 2020/0058825 | A1* | 2/2020 | Jang ................. H01L 33/06 |
| 2020/0091389 | A1* | 3/2020 | Jang ................. H01L 33/50 |
| 2020/0144326 | A1* | 5/2020 | Lee .................. H01L 27/15 |
| 2020/0144448 | A1* | 5/2020 | Lee .................. H01L 33/382 |
| 2020/0144470 | A1* | 5/2020 | Jang ................. H01L 33/52 |
| 2020/0152691 | A1 | 5/2020 | Lee |
| 2020/0212017 | A1 | 7/2020 | Oh et al. |
| 2020/0258872 | A1* | 8/2020 | Lee .................. H01L 33/42 |
| 2020/0266318 | A1* | 8/2020 | Lee .................. H01L 25/0753 |
| 2021/0126044 | A1* | 4/2021 | Chae ................. G09G 3/32 |

FOREIGN PATENT DOCUMENTS

| | | |
|---|---|---|
| JP | 2014-175427 | 9/2014 |
| JP | 2015-012244 | 1/2015 |
| JP | 2019-509636 | 4/2019 |
| KR | 10-2017-0115142 | 10/2017 |
| KR | 10-2019-0001050 | 1/2019 |

OTHER PUBLICATIONS

Notice of Allowance issued May 12, 2021, in U.S. Appl. No. 16/815,823.
Notice of Allowance issued Aug. 18, 2021, in U.S. Appl. No. 16/815,823.
Supplemental Notice of Allowance issued Oct. 15, 2021, in U.S. Appl. No. 16/815,823.
European Search Report dated Nov. 10, 2022, issued to European Patent Application No. 20771030.2.

* cited by examiner

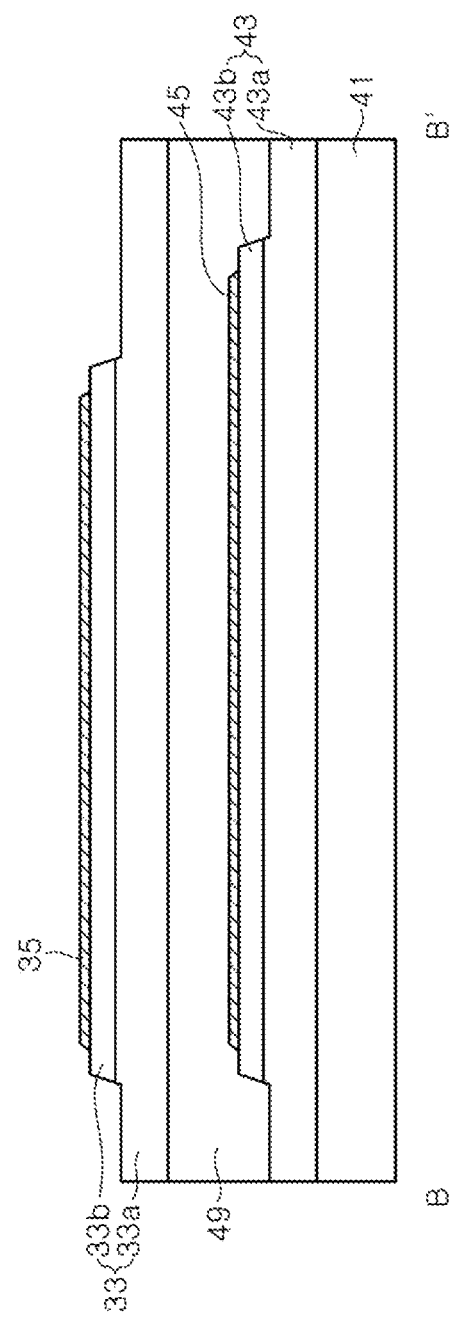

LIGHT EMITTING DEVICE FOR DISPLAY AND DISPLAY APPARATUS HAVING THE SAME

CROSS-REFERENCE TO RELATED APPLICATIONS

This application is a Continuation of U.S. patent application Ser. No. 16/815,823, filed on Mar. 11, 2020, which claims the benefit of U.S. Provisional Patent Application No. 62/817,704, filed on Mar. 13, 2019, each of which is hereby incorporated by reference for all purposes as if fully set forth herein.

BACKGROUND

Field

Exemplary embodiments of the invention relate generally to a light emitting device for a display and a display apparatus, and, more particularly, to a light emitting device having a stack structure of a plurality of LEDs for a display, and a display apparatus including the same.

Discussion of the Background

As an inorganic light source, light emitting diodes have been used in various fields, such as displays, vehicular lamps, general lighting, and the like. With various advantages of the light emitting diodes, such as longer lifespan, lower power consumption, and faster response, than existing light sources, light emitting diodes have been replacing conventional light sources.

Light emitting diodes have been generally used as backlight light sources in display apparatuses. However, LED displays that directly display images using the light emitting diodes have been recently developed.

In general, a display apparatus displays various colors through mixture of blue, green, and red light. In order to display various images, the display apparatus includes a plurality of pixels, each including sub-pixels corresponding to one of blue, green, and red light. As such, a color of a certain pixel is typically determined based on the colors of the sub-pixels so that images can be realized through the combination of such pixels.

Since LEDs can emit various colors depending upon materials thereof, individual LED chips emitting blue, green, and red light may be arranged on a two-dimensional plane to provide a display apparatus. However, when one LED chip is provided to each sub-pixel, the number of LED chips may be increased, which may require excessive time for a mounting process during manufacture.

Moreover, when the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

The above information disclosed in this Background section is only for understanding of the background of the inventive concepts, and, therefore, it may contain information that does not constitute prior art.

SUMMARY

Light emitting devices for a display constructed according to exemplary embodiments of the invention are capable of increasing an area of each sub-pixel in a restricted pixel area, and a display apparatus including the same.

Exemplary embodiments also provide a light emitting device for a display that is capable of reducing a time associated with a mounting process and a display apparatus including the same.

Exemplary embodiments further provide a light emitting device for a display and a display apparatus that is capable of increasing the production yield and a display apparatus including the same.

Additional features of the inventive concepts will be set forth in the description which follows, and in part will be apparent from the description, or may be learned by practice of the inventive concepts.

A light emitting device for a display according to an exemplary embodiment includes: a first LED stack; a second LED stack disposed under the first LED stack; a third LED stack disposed under the second LED stack; and bump pads disposed on the first LED stack, in which each of the first to third LED stacks includes a first conductivity type semiconductor layer and a second conductivity type semiconductor layer disposed on the first conductivity type semiconductor layer and exposing at least a portion of the first conductivity type semiconductor layer, the first LED stack includes upper through-holes passing through the first conductivity type semiconductor layer of the first LED stack, the second LED stack includes lower through-holes passing through the first conductivity type semiconductor layer of the second LED stack, the bump pads include first to third bump pads and a common bump pad, the first bump pad is electrically connected to the second conductivity type semiconductor layer of the first LED stack, the second bump pad is electrically connected to the second conductivity type semiconductor layer of the second LED stack through one of the upper through-holes of the first LED stack, the third bump pad is electrically connected to the second conductivity type semiconductor layer of the third LED stack through another one of the upper through-holes and one of the lower through-holes of the second LED stack, and the common bump pad is commonly electrically connected to the exposed first conductivity type semiconductor layers of the first to third LED stacks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, and 13D are schematic plan views and cross-sectional views illustrating a method of manufacturing a light emitting device for a display according to an exemplary embodiment.

DETAILED DESCRIPTION

Figure 1:
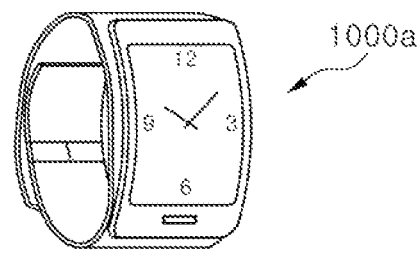
FIG. 1 shows schematic perspective views illustrating display apparatuses according to exemplary embodiments.
Figure 1:
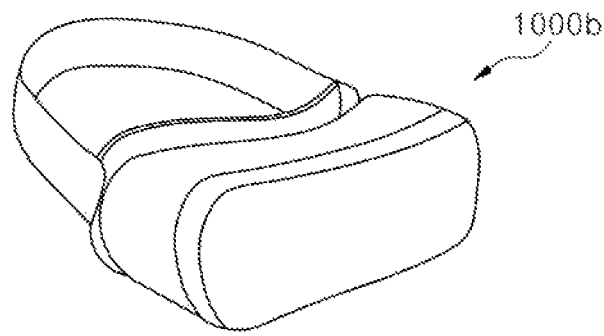
Figure 1:
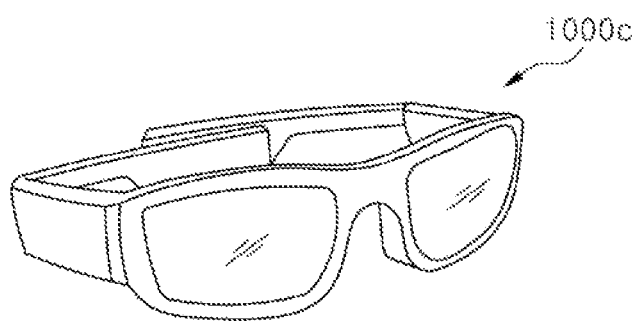

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting device for a display according to an exemplary embodiment includes: a first LED stack; a second LED stack disposed under the first LED stack; a third LED stack disposed under the second LED stack; and bump pads disposed on the first LED stack, in which each of the first to third LED stacks includes a first conductivity type semiconductor layer and a second conductivity type semiconductor layer disposed on the first conductivity type semiconductor layer, the first LED stack includes the first conductivity type semiconductor layer exposed through the second conductivity type semiconductor layer, and also has upper through-holes passing through the first conductivity type semiconductor layer, the second LED stack includes the first conductivity type semiconductor layer exposed through the second conductivity type semiconductor layer, and also has lower through-holes passing through the first conductivity type semiconductor layer, the third LED stack includes the first conductivity type semiconductor layer exposed through the second conductivity type semiconductor layer, the bump pads include first to third bump pads and a common bump pad, the first bump pad is electrically connected to the second conductivity type semiconductor layer of the first LED stack, the second bump pad is electrically connected to the second conductivity type semiconductor layer of the second LED stack through one of the upper through-holes, the third bump pad is electrically connected to the second conductivity type semiconductor layer of the third LED stack through another one of the upper through-holes and one of the lower through-holes, and the common bump pad is commonly electrically connected to the exposed first conductivity type semiconductor layers of the first to third LED stacks.

Hereinafter, the second LED stack is described as being disposed under the first LED stack, and the third LED stack is described as being disposed under the second LED stack, however, in some exemplary embodiments, the light emitting device may be flip-bonded. In this case, upper and lower positions of these first to third LED stacks may be reversed.

When the first to third LED stacks are stacked one above another, the light emitting device may have an increased luminous area of each sub-pixel without increasing a pixel area.

In addition, since all of the first to third LED stacks have a structure where the second conductivity type semiconductor layer is disposed over the first conductivity type semiconductor layer, a manufacturing process thereof may be stabilized and light loss may be prevented.

The first LED stack may emit light having a longer wavelength than that emitted from the second LED stack, and the second LED stack may emit light having a longer wavelength than that emitted from the third LED stack. For example, the first, second and third LED stacks may emit red light, green light and blue light, respectively. In another exemplary embodiment, the first LED stack may emit light having a longer wavelength than that emitted from the third LED stack, and the second LED stack may emit light having a shorter wavelength than that emitted from the third LED stack. For example, the first, second and third LED stacks may emit red light, blue light, and green light, respectively.

The first to third LED stacks may be independently driven, light generated from the first LED stack may be emitted to the outside through the second LED stack and the third LED stack, and light generated from the second LED stack may be emitted to the outside through the third LED stack.

The common bump pad may be connected to the first conductivity type semiconductor layer of the second LED stack through the upper through-hole of the first LED stack, and connected to the first conductivity type semiconductor layer of the third LED stack through the lower through-hole of the second LED stack.

The light emitting device may further include a second transparent electrode interposed between the first LED stack and the second LED stack, and being in ohmic contact with the second conductivity type semiconductor layer of the second LED stack; and a third transparent electrode interposed between the second LED stack and the third LED stack, and being in ohmic contact with the second conductivity type semiconductor layer of the third LED stack, in which the second and third bump pads may be electrically connected to the second and third transparent electrodes, respectively.

The light emitting device may further include a first electrode disposed on the first LED stack and being in ohmic contact with the second conductivity type semiconductor layer of the first LED stack, in which the first bump pad may be electrically connected to the first electrode.

In one exemplary embodiment, one of the first electrode, the second transparent electrode, and the third transparent electrode may be formed of a material different from one another. For example, the first electrode may be formed of indium-tin-oxide (ITO), and the second and third transparent electrodes may be formed of ZnO.

In one exemplary embodiment, the second and third transparent electrodes may be recessed to have a smaller area than that of the second conductivity type semiconductor layer of the second LED stack and that of the second conductivity type semiconductor layer of the third LED stack, respectively. The first electrode may also be recessed to have a smaller area than that of the second conductivity type semiconductor layer of the first LED stack.

The second and third transparent electrodes are recessed, and thus, they may be prevented from being damaged by etching gas during the manufacturing process.

The light emitting device may further include an insulation layer covering side surfaces of the first to third LED stacks, in which the insulation layer may be in contact with side surfaces of the first conductivity type semiconductor layers of the first to third LED stacks, and side surfaces of the second and third transparent electrodes may be spaced apart from the insulation layer.

The light emitting device may further include an n-electrode pad disposed on the first conductivity type semiconductor layer of the third LED stack; and a lower p-electrode pad disposed on the third transparent electrode, in which an upper surface of the n-electrode pad may be located at substantially the same elevation as that of the lower p-electrode pad.

The upper surface of the n-electrode pad and that of the p-electrode pad are set to be located at substantially the same elevation, and thus, any one of the pads may be prevented from being damaged during the manufacturing process.

The light emitting device may further include a first bonding layer interposed between the second LED stack and the third LED stack; and a second bonding layer interposed between the first LED stack and the second LED stack, in which the lower through-holes of the second LED stack may pass through the first bonding layer to expose the n-electrode pad and the lower p-electrode pad, respectively.

The light emitting device may further include a lower common connector connected to the first conductivity type semiconductor layer of the second LED stack and the n electrode pad of the third LED stack; a lower p-connector connected to the lower p-electrode pad; and an upper p-electrode pad disposed on the second transparent electrode, in which the lower common connector and the lower p-connector may be electrically connected to the n-electrode pad and the lower p-electrode pad through the lower through-holes of the second LED stack, respectively.

The upper through-holes of the first LED stack may pass through the second bonding layer to expose the lower common connector, the lower p-connector and the upper p-electrode pad, respectively.

Regions of the upper p-electrode pad, the lower common connector, and the lower p-connector exposed by the upper through-holes of the first LED stack may be located at substantially the same elevation as one another.

The light emitting device may further include first to third upper connectors and an upper common connector disposed on the first LED stack, in which the first upper connector may be electrically connected to the second conductivity type semiconductor layer of the first LED stack, the second upper connector, the third upper connector and the upper common connector may be electrically connected to the upper p-electrode pad, the lower p-connector, and the lower common connector through the upper through-holes of the first LED stack, respectively, and the bump pads may be disposed on the first to third upper connectors and the upper common connector, respectively.

The bump pads may be located on flat portions of the first to third upper connectors and the upper common connector, respectively.

The light emitting device may further include an upper insulation layer covering the first to third upper connectors and the upper common connector, in which the upper insulation layer may have openings exposing the first to third upper connectors and the upper common connector, and each of the bump pads may be disposed in the openings.

The light emitting device may further include an intermediate insulation layer disposed between the first LED stack and the upper connectors, in which the intermediate insulation layer covers a side surface of the light emitting device and sidewalls of the upper through-holes of the first LED stack, and may include openings exposing the upper p-electrode pad, the lower p connector, and the lower common connector.

The first to third LED stacks may be isolated from a growth substrate.

A display apparatus according to an exemplary embodiment includes: a circuit board; and a plurality of light emitting devices arranged on the circuit board, in which each of the light emitting devices may be any one of the light emitting device set forth above and the bump pads are electrically connected to the circuit board.

Hereinafter, exemplary embodiments of the inventive concepts will be described in detail with reference to the accompanying drawings.

FIG. 1 shows schematic perspective views illustrating display apparatuses according to exemplary embodiments.

The display apparatus according to exemplary embodiments may be used in a VR display apparatus, such as a smart watch 1000a, a VR headset 1000b, or an AR display apparatus, such as augmented reality glasses 1000c. However, the inventive concepts are not limited thereto. The display apparatus may include a display panel for implementing an image.

Figure 2:
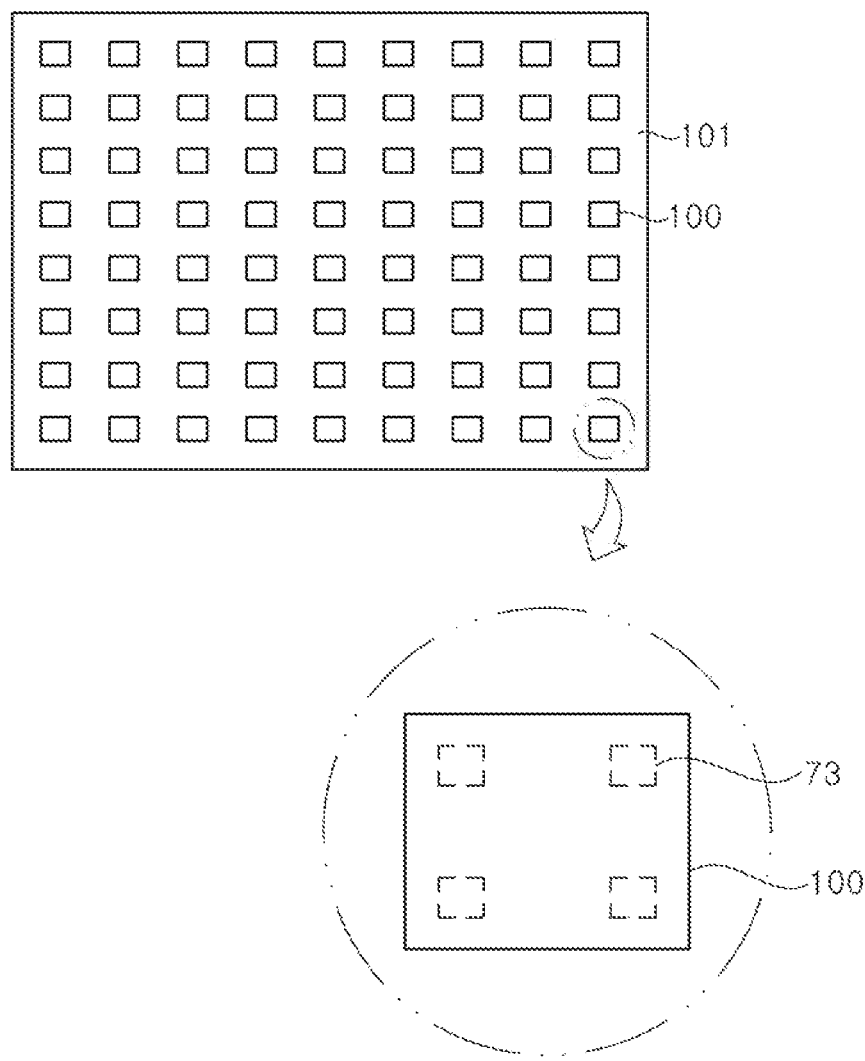
FIG. 2 is a schematic plan view illustrating a display panel according to an exemplary embodiment.

FIG. 2 is a schematic plan view illustrating the display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 are arranged on the circuit board 101. Each of the light emitting devices 100 may form one pixel. The light emitting device 100 includes bump pads 73, and the bump pads 73 are electrically connected to the circuit board 101. For example, the bump pads 73 may be bonded to pads exposed on the circuit board 101.

An interval between the light emitting devices 100 may be greater than at least a width of the light emitting device 100.

Figure 3A:
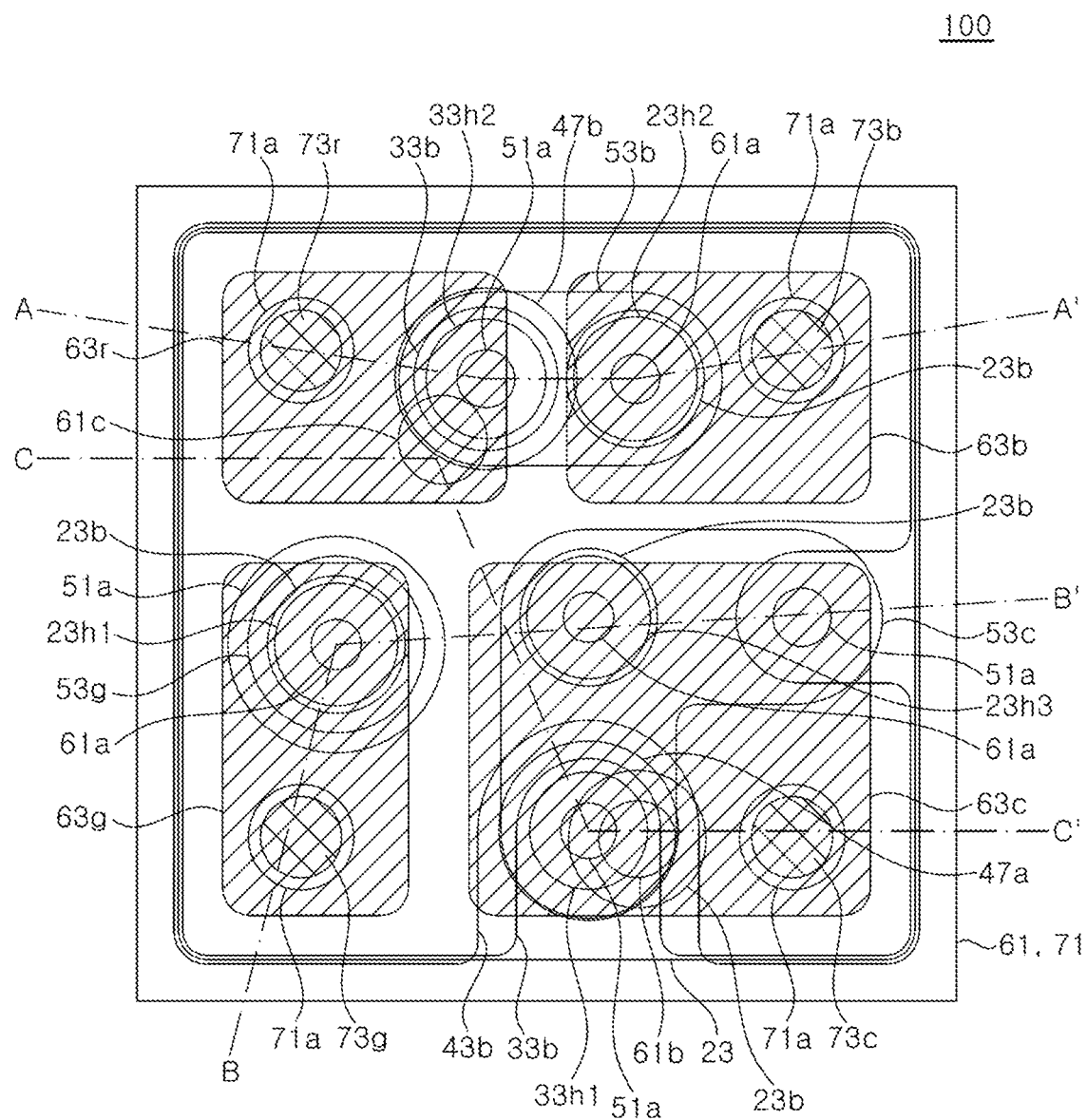
FIG. 3A is a schematic plan view illustrating a light emitting device according to an exemplary embodiment
Figure 3B:
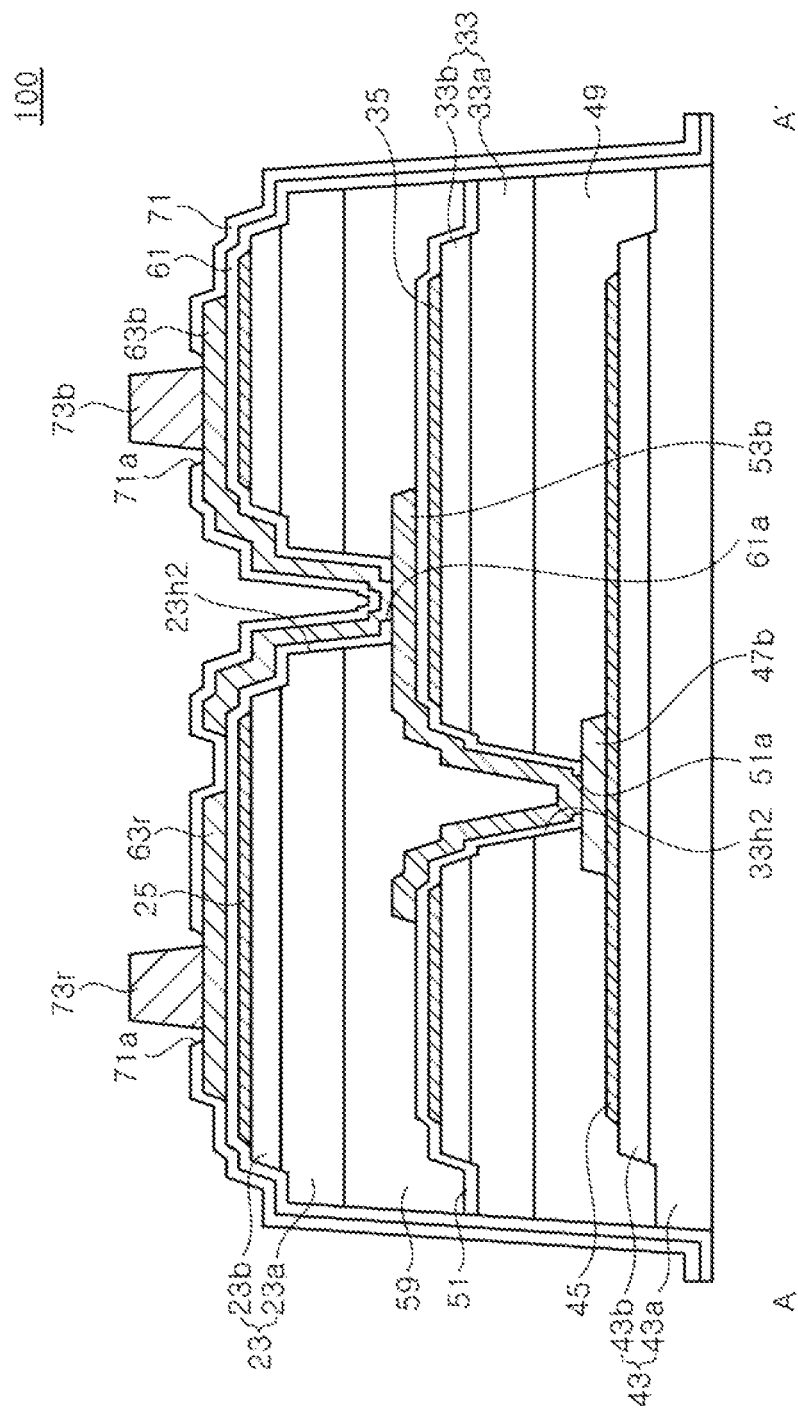
FIG. 3B, FIGS. 3C, and 3D are schematic cross-sectional views taken along lines A-A', B-B', and C-C' of FIG. 3A, respectively.
Figure 3C:
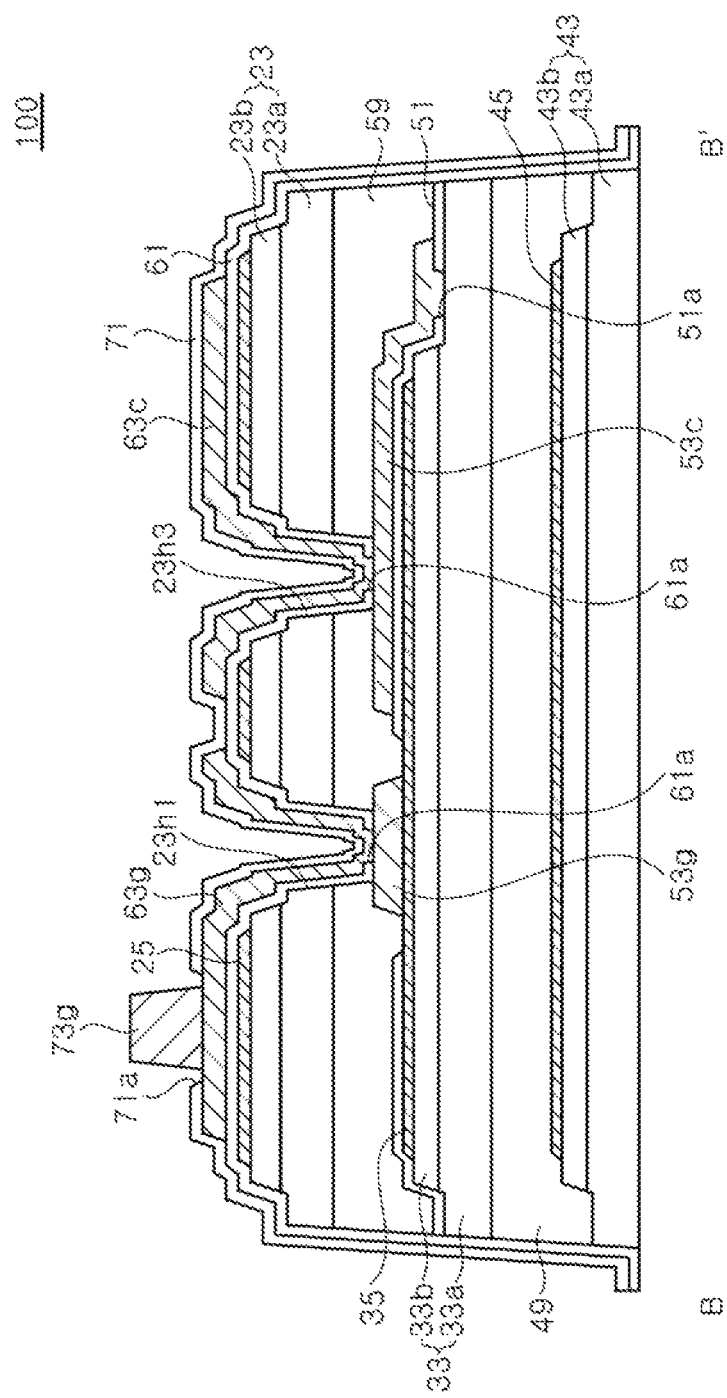
Figure 3D:
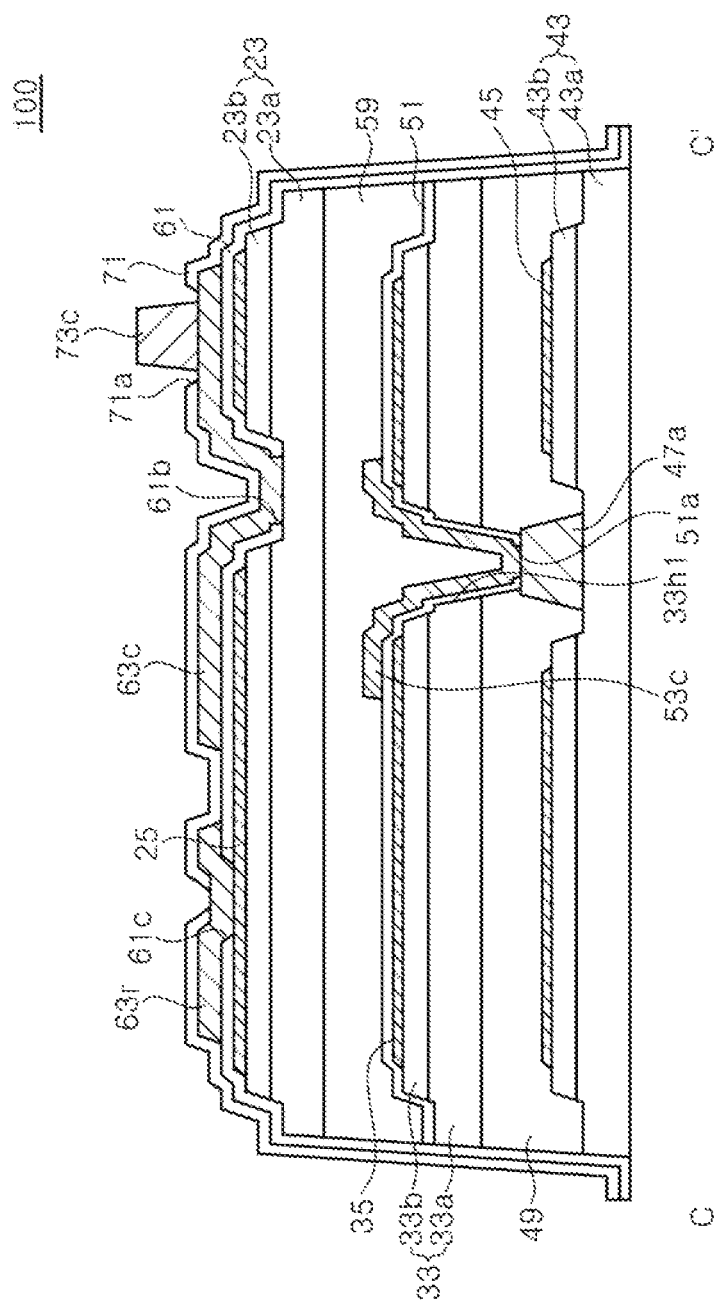

A configuration of the light emitting device 100 according to an exemplary embodiment will be described with reference to FIG. 3A, FIG. 3B, FIG. 3C, and FIG. 3D. FIG. 3A is a schematic plan view illustrating the light emitting device 100 according to an exemplary embodiment. FIG. 3B, FIGS. 3C, and 3D are schematic cross-sectional views taken along lines A-A', B-B', and C-C' of FIG. 3A, respectively. Hereinafter, although the bump pads 73r, 73b, 73g, and 73c are exemplarily illustrated and described as being disposed at an upper side in FIG. 3A to FIG. 3D, the inventive concepts are not limited thereto. For example, in some exemplary embodiments, the light emitting device 100 may be flip-bonded on the circuit board 101 shown in FIG. 2, and in this case, the bump pads 73r, 73b, 73g, and 73c may be disposed at a lower side.

Referring to FIG. 3A, FIG. 3B, FIG. 3C, and FIG. 3D, the light emitting device 100 may include a first LED stack 23, a second LED stack 33, a third LED stack 43, a first electrode 25, a second transparent electrode 35, a third transparent electrode 45, an n-electrode pad 47a, a lower p-electrode pad 47b, an upper p-electrode pad 53g, a lower p-connector 53b, a lower common connector 53c, an upper common connector 63c, a first upper connector 63r, a second upper connector 63g, a third upper connector 63b, a first bonding layer 49, a second bonding layer 59, a lower insulation layer 51, an intermediate insulation layer 61, an upper insulation layer 71, and bump pads 73r, 73b, 73g, and 73c. The light emitting device 100 may further include upper through-holes 23h1, 23h2, and 23h3 passing through the first LED stack 23, and lower through-holes 33h1 and 33h2 passing through the second LED stack 33.

As shown in FIG. 3B, the first, second, and third LED stacks 23, 33, and 43 according to an exemplary embodiment are stacked in the vertical direction. The first, second, and third LED stacks 23, 33, and 43 may be grown on different growth substrates from one another. According to the illustrated exemplary embodiment, each of the growth substrates may be removed from the final light emitting device 100. As such, the light emitting device 100 according to the illustrated exemplary embodiment does not include the growth substrate of the first, second, and third LED stacks 23, 33, and 43. However, the inventive concepts are not limited thereto, and in some exemplary embodiments, at least one of the growth substrates may be included in the light emitting device 100.

Each of the first LED stack 23, the second LED stack 33, and the third LED stack 43 includes a first conductivity type semiconductor layer 23*a*, 33*a*, or 43*a*, a second conductivity type semiconductor layer 23*b*, 33*b*, or 43*b*, and an active layer interposed therebetween. The active layer may have a multiple quantum well structure, for example.

The second LED stack 33 is disposed under the first LED stack 23, and the third LED stack 43 is disposed under the second LED stack 33. Light generated in the first to third LED stacks 23, 33, and 43 may be emitted to the outside through the third LED stack 43.

In an exemplary embodiment, the first LED stack 23 emits light having a longer wavelength than those emitted from the second and third LED stacks 33 and 43, and the second LED stack 33 emits light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light. For example, the first LED stack 23 may include an AlGaInP-based well layer, the second LED stack 33 may include an AlGaInP or AlGaInN-based well layer, and the third LED stack 43 may include an AlGaInN-based well layer.

Since the first LED stack 23 emits light having a longer wavelength than those emitted from the second and third LED stacks 33 and 43, light generated from the first LED stack 23 may be emitted to the outside after passing through the second and third LED stacks 33 and 43. In addition, since the second LED stack 33 emits light having a longer wavelength than that emitted from the third LED stack 43, light generated from the second LED stack 33 may be emitted to the outside after passing through the third LED stack 43.

In another exemplary embodiment, the first LED stack 23 may emit light having a longer wavelength than those emitted from the second and third LED stacks 33 and 43, and the second LED stack 33 may emit light having a shorter wavelength than that emitted from the third LED stack 43. For example, the first LED stack 23 may be an inorganic light emitting diode emitting red light, the second LED stack 33 may be an inorganic light emitting diode emitting blue light, and the third LED stack 43 may be an inorganic light emitting diode emitting green light. For example, the first LED stack 23 may include an AlGaInP-based well layer, the second LED stack 33 may include an AlGaInN-based well layer, and the third LED stack 43 may include an AlGaInP-based or AlGaInN-based well layer.

A portion of light generated in the second LED 33 stack may be absorbed in the third LED stack 43, and thus, luminous intensity of light emitted from the second LED stack 33 may be relatively lower than that of light emitted from the first or third LED stacks 23 or 43. Accordingly, a ratio of luminance intensity of light emitted from the first to third LED stacks 23, 33, and 43 may be controlled.

According to the illustrated exemplary embodiment, the first conductivity type semiconductor layer 23*a*, 33*a* or 43*a* of each of the LED stacks 23, 33, and 43 may be an n-type semiconductor layer, and the second conductivity type semiconductor layer 23*b*, 33*b* or 43*b* thereof may be a p-type semiconductor layer. In addition, according to the illustrated exemplary embodiment, an upper surface of the first LED stack 23 may be a p-type semiconductor layer 23*b*, an upper surface of the second LED stack 33 may be a p-type semiconductor layer 33*b*, and an upper surface of the third LED stack 43 may be a p-type semiconductor layer 43*b*. More particularly, the first to third LED stacks 23, 33, and 43 are all stacked with n-type and p-type semiconductor layers in the same direction. The semiconductor layers of the first LED stack 23 and the second LED stack 33 are stacked in the same order as the semiconductor layers of the third LED stack 43, and thus, process stability may be enhanced, which will be described in more detail later with reference to a manufacturing method.

The first LED stack 23 includes a mesa etching region, in which a portion of the second conductivity type semiconductor layer 23*b* is removed to expose the first conductivity type semiconductor layer 23*a*. The upper through-holes 23*h*1, 23*h*2, and 23*h*3 may be formed in the mesa etching region, and thus, sidewalls of the upper through-holes 23*h*1, 23*h*2, and 23*h*3 may have a stepped structure. In addition, the upper common connector 63*c* is electrically connected to the first conductivity type semiconductor layer 23*a* exposed in the mesa etching region, which will be described later.

The second LED stack 33 includes a mesa etching region, in which the second conductivity type semiconductor layer 33*b* is removed to expose an upper surface of the first conductivity type semiconductor layer 33*a*. The third LED stack 43 also includes a mesa etching region, in which the second conductivity type semiconductor layer 43*b* is removed to expose an upper surface of the first conductivity type semiconductor layer 43*a*. The lower through-holes 33*h*1 and 33*h*2 may be formed in the mesa etching region, and thus, sidewalls of the lower through-holes 33*h*1 and 33*h*2 may have a stepped structure.

The third LED stack 43 according to an exemplary embodiment may have a flat lower surface, without being limited thereto. For example, in some exemplary embodiments, the third LED stack 43 may include irregularities on a surface of the first conductivity type semiconductor layer 43*a*, and light extraction efficiency may be improved by the irregularities. The irregularities on the surface of the first conductivity type semiconductor layer 43*a* may be formed by separating a patterned sapphire substrate or by texturing the surface after separating the growth substrate, for example. In some exemplary embodiments, the first conductivity type semiconductor layer 33*a* of the second LED stack 33 may also have a textured surface.

The first LED stack 23, the second LED stack 33, and the third LED stack 43 according to the illustrated exemplary embodiment may be stacked to overlap one another, and may also have substantially the same luminous area. However, the luminous area of the first LED stack 23 may be smaller than that of the second LED stack 33, and the luminous area of the second LED stack 33 may be smaller than that of the third LED stack 43, by the upper through-holes 23*h*1, 23*h*2, and 23*h*3 and the lower through-holes 33*h*1 and 33*h*2. In addition, a side surface of the light emitting device 100 may be inclined, such that a width of the light emitting device 100 may be gradually increasing from the first LED stack 23 to the third LED stack 43. As such, the luminous area of the third LED stack 43 may be larger than that of the first LED stack 23. An inclination angle of the side surface of the light emitting device 100 with respect to the upper surface of the third LED stack 43 may be about 75 degrees to about 90 degrees. When the inclination angle is less than 75 degrees, the luminous area of the first LED stack 23 may become too small, and thus, it may be difficult to reduce a size of the light emitting device 100.

The first electrode 25 is disposed on the first LED stack 23. The first electrode 25 is in ohmic contact with the second conductivity type semiconductor layer 23b of the first LED stack 23. The first electrode 25 may be formed using a transparent oxide layer or a metal layer, such as indium tin oxide (ITO). The first electrode 25 may cover almost an entire surface of the second conductivity type semiconductor layer 23b. According to an exemplary embodiment, the first electrode 25 may be formed to be transparent, without being limited thereto. In some exemplary embodiments, the first electrode 25 may not be transparent, which will be described in more detail below. Hereinafter, the first electrode 25 will also be referred to as a first transparent electrode 25. In some exemplary embodiments, the first transparent electrode 25 may be omitted.

A second transparent electrode 35 is in ohmic contact with the second conductivity type semiconductor layer 33b of the second LED stack 33. As shown in the drawings, the second transparent electrode 35 contacts the upper surface of the second LED stack 33 between the first LED stack 23 and the second LED stack 33. The second transparent electrode 35 may be formed of a metal layer or a conductive oxide layer that is transparent to red light. For example, the conductive oxide layer may include $SnO_2$, $InO_2$, ITO, ZnO, IZO, or the like. In particular, the second transparent electrode 35 may be formed of ZnO, which may be formed as a single crystal on the second LED stack 33. ZnO may have favorable electrical and optical characteristics as compared with the metal layer or other conductive oxide layers. In particular, ZnO has a strong bonding force to the second LED stack 33 and remains undamaged even when the growth substrate is separated using a laser lift-off process during manufacture.

The second transparent electrode 35 may be partially removed along an edge of the second LED stack 33, and, accordingly, an outer side surface of the second transparent electrode 35 is not exposed to the outside, but is covered with the lower insulation layer 51. In particular, the side surface of the second transparent electrode 35 is recessed inwardly than that of the second LED stack 33, and a region where the second transparent electrode 35 is recessed is filled with the lower insulation layer 51 and the second bonding layer 59. The second transparent electrode 35 is also recessed near the mesa etching region of the second LED stack 33, and the recessed region is filled with the lower insulation layer 51 and the second bonding layer 59.

The third transparent electrode 45 is in ohmic contact with the second conductivity type semiconductor layer 43b of the third LED stack 43. The third transparent electrode 45 may be disposed between the second LED stack 33 and the third LED stack 43, and contacts the upper surface of the third LED stack 43. The third transparent electrode 45 may be formed of a metal layer or a conductive oxide layer that is transparent to red light and green light. For example, the conductive oxide layer may include $SnO_2$, $InO_2$, ITO, ZnO, IZO, or the like. In particular, the third transparent electrode 45 may be formed of ZnO, which may be formed as a single crystal on the third LED stack 43. ZnO may have favorable electrical and optical characteristics as compared with the metal layer or other conductive oxide layers. In particular, ZnO has a strong bonding force to the third LED stack 43 and remains undamaged even when the growth substrate is separated using the laser lift-off process during manufacture.

The third transparent electrode 45 may be partially removed along an edge of the third LED stack 43, and, accordingly, an outer side surface of the third transparent electrode 45 is not exposed to the outside, but is covered with the first bonding layer 49. In particular, the side surface of the third transparent electrode 45 is recessed inwardly than that of the third LED stack 43, and a region where the third transparent electrode 45 is recessed is filled with the first bonding layer 49. The third transparent electrode 45 is also recessed near the mesa etching region of the third LED stack 43, and the recessed region is filled with the first bonding layer 49.

The second transparent electrode 35 and the third transparent electrode 45 are recessed as described above, and thus, the side surfaces of the second transparent electrode 35 and the third transparent electrode 45 may be prevented from being exposed to an etching gas, thereby improving the production yield of the light emitting device 100. The first transparent electrode 25 may also be formed to be recessed in advance.

According to an exemplary embodiment, the second transparent electrode 35 and the third transparent electrode 45 may be formed of substantially the same conductive oxide layer, for example, ZnO, and the first transparent electrode 25 may be formed of a different conductive oxide layer from the second and third transparent electrodes 35 and 45, such as ITO. However, the inventive concepts are not limited thereto, and each of the first to third transparent electrodes 25, 35, and 45 may include to same material or at least one of the first to third transparent electrodes 25, 35, and 45 may include a different material.

The first to third transparent electrodes 25, 35, and 45 may be formed using a technique, such as thermal deposition, sputtering, sol-gel, hydrothermal synthesis, or the like. In particular, a transparent electrode formed through a chemically thin-film forming method, such as hydrothermal synthesis method, may generate a porous thin-film. In this case, voids in the porous thin-film may improve the light extraction efficiency of the LED stack, and may further relieve stress.

The voids may be controlled to be distributed at locations to enhance the optical properties of the LED stack. According to an exemplary embodiment, the voids may be distributed generally close to a side of the second conductivity type semiconductor layer 22b, 33b, and 43b at one half point of the transparent electrode. The transparent electrode formed through the hydrothermal synthesis method may have voids and also have crystallinity, and, in particular, may be formed of a single crystal.

According to another exemplary embodiment, the voids may be distributed relatively uniformly over a wide area. The transparent electrode including the voids has an improved light extraction efficiency compared to a transparent electrode without the voids. The transparent electrode may be, for example, a ZnO layer or a doped ZnO layer. The doped ZnO layer may include at least one of, for example, silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd), as a dopant.

In an exemplary embodiment, the ZnO layer may also include a ZnO seed layer and a ZnO bulk layer. The ZnO seed layer has a relatively continuous surface. In addition, the ZnO seed layer and the ZnO bulk layer form a single crystal structure. In an exemplary embodiment, the ZnO seed layer and the ZnO bulk layer do not exhibit any interface between the ZnO seed layer and the ZnO bulk layer. In an exemplary embodiment, the ZnO seed layer has a thickness of several hundred angstroms. The ZnO seed layer may have, for example, a thickness of 200 angstroms or less. The ZnO bulk layer may have a thickness of 1 μm or less. In an exemplary embodiment, the ZnO bulk layer has a thickness of 8000 angstroms or less.

The n-electrode pad 47a is in ohmic contact with the first conductivity type semiconductor layer 43a of the third LED stack 43. The n-electrode pad 47a may be disposed on the first conductivity type semiconductor layer 43a exposed through the second conductivity type semiconductor layer 43b, that is, in the mesa etching region. The n-electrode pad 47a may be formed of, for example, Cr/Au/Ti. An upper surface of the n-electrode pad 47a may be placed higher than that of the second conductivity type semiconductor layer 43b, and further, higher than that of the third transparent electrode 45. For example, a thickness of the n-electrode pad 47a may be about 2 μm or more. The n-electrode pad 47a may have a shape of a truncated cone, but is not limited thereto. The n-electrode pad 47a may have various shapes, such as a square pyramid, a cylindrical shape, or a cylindrical shape.

The lower p-electrode pad 47b may include substantially the same material as the n-electrode pad 47a. An upper surface of the lower p-electrode pad 47b is located substantially at the same elevation as that of the n-electrode pad 47a, and, accordingly, a thickness of the lower p-electrode pad 47b may be less than that of the n-electrode pad 47a. More particularly, the thickness of the lower p-electrode pad 47b may be approximately equal to a thickness of a portion of the n-electrode pad 47a protruding above the second transparent electrode 45. For example, the thickness of the lower p-electrode pad 47b may be about 1.2 μm or less. The upper surface of the lower p-electrode pad 47b is located at substantially the same elevation as that of the n-electrode pad 47a, and thus, the lower p-electrode pad 47b and the n-electrode pad 47a may be set to be simultaneously exposed when the lower through-holes 33h1 and 33h2 are formed. When the elevations of the electrode pad 47a and the lower p-electrode pad 47b are different, any one of the electrode pads may be damaged in the etching process. As such, the elevations of the n-electrode pad 47a and the lower p-electrode pad 47b are set to be approximately equal, and thus, it is possible to prevent any one of the electrode pads from being damaged during the etching process or the like.

The first bonding layer 49 couples the second LED stack 33 to the third LED stack 43. The first bonding layer 49 may be disposed between the first conductivity type semiconductor layer 33a and the third transparent electrode 45. The first bonding layer 49 may partially contact the second conductivity type semiconductor layer 43b, and may partially contact the first conductivity type semiconductor layer 43a exposed by the mesa etching region. In addition, the first bonding layer 49 may cover the n-electrode pad 47a and the lower p-electrode pad 47.

The first bonding layer 49 may be formed of a transparent organic material layer, or may be formed of a transparent inorganic material layer. For example, the organic material layer may include SU8, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 49 may be formed of spin-on-glass (SOG).

The lower through-hole 33h1 and the lower through-hole 33h2 pass through the second LED stack 33 and the first bonding layer 49 to expose the n-electrode pad 47a and the lower p-electrode pad 47b, respectively. As described above, the lower through-holes 33h1 and 33h2 may be formed in the mesa etching region, and thus, the lower through-holes 33h1 and 33h2 may have stepped sidewalls.

The lower insulation layer 51 is formed on the second LED stack 33, and covers the second transparent electrode 35. The lower insulation layer 51 also covers the sidewalls of the lower through-holes 33h1 and 33h2. The lower insulation layer 51 may have openings 51a exposing the n-electrode pad 47a, the lower p-electrode pad 47b, the first conductivity type semiconductor layer 33a, and the second transparent electrode 35. The lower insulation layer 51 may be formed of a silicon oxide film or a silicon nitride film, and may be formed to have a thickness of, for example, about 800 nm.

The lower common connector 53c may be disposed on the lower insulation layer 51, and connected to the first conductivity type semiconductor layer 33a and the n-electrode pad 47a exposed through the openings 51a of the lower insulation layer 51. In particular, the lower common connector 53c is connected to the first conductivity type semiconductor layer 33a in the mesa etching region of the second LED stack 33, and is connected to the n-electrode pad 47a through the lower through-hole 33h1.

The lower p-connector 53b may be disposed on the lower insulation layer 51, and connected to the lower p-electrode pad 47b exposed through the opening 51a of the lower insulation layer 51. At least a portion of the lower p-connector 53b may be disposed on the lower insulation layer 51.

The upper p-electrode pad 53g may be disposed on the second transparent electrode 35 in the opening 51a of the lower insulation layer 51. As shown in FIG. 3A and FIG. 3B, the upper p-electrode pad 53g may be disposed in the opening 51a with a narrower width than that of the opening 51a. However, the inventive concepts are not limited thereto, and in some exemplary embodiments, the width of the upper p-electrode pad 53g may be greater than that of the opening 51a, and a portion of the upper p-electrode pad 53g may be disposed on the lower insulation layer 51.

The lower common connector 53c, the lower p-connector 53b, and the upper p-electrode pad 53g may be formed together in the same process and may include substantially the same material. For example, the lower common connector 53c, the lower p-connector 53b, and the upper p-electrode pad 53g may include Ni/Au/Ti, and may be formed to have a thickness of about 2 μm. However, the present disclosure is not limited thereto. For example, in some exemplary embodiments, the upper p-electrode pad 53g may be formed in a process separated from the lower common connector 53c and the lower p-connector 53b, to match elevations of the lower common connector 53c and the lower p-connector 53b with an elevation of the upper p-electrode pad 53g.

The second bonding layer 59 couples the first LED stack 23 to the second LED stack 33. As shown, the second bonding layer 59 may be disposed between the first conductivity type semiconductor layer 23a and the lower insulation layer 51. The second bonding layer 59 may also cover the lower common connector 53c, the lower p-connector 53b and the upper p-electrode pad 53g. The second bonding layer 59 may also partially contact the second transparent electrode 35 exposed through the opening 51a of the lower insulation layer 51. The second bonding layer 59 may include substantially the same material that may form the first bonding layer 49 described above, and thus, repeated descriptions thereof will be omitted to avoid redundancy.

When the first transparent electrode 25 is disposed under the first conductivity type semiconductor layer 23a the second bonding layer 59 may be disposed between the first transparent electrode 25 and the lower common connector 53c, the lower p-connector 53b, and the upper p-electrode pad 53g. In this case, an electrical short circuit may occur between the first transparent electrode 25 and the lower common connector 53c, the lower p-connector 53b, and the upper p-electrode pad 53g, and, accordingly, malfunctions of sub-pixels may occur. In addition, when the first transparent electrode 25 is disposed between the first LED stack 23 and the second LED stack 33 rather than being disposed on an upper surface thereof, the first LED stack 23 has to be etched to expose the first transparent electrode 25 for electrical connection. In this case, in order to not to pass through the first transparent electrode 25 while the first LED stack 23 is etched, the first transparent electrode 25 may need to be formed relatively thick to expose the first transparent electrode 25. Accordingly, substantial light loss may occur while light generated in the first LED stack 23 passes through the first transparent electrode 25.

However, according to the illustrated exemplary embodiment, the first transparent electrode 25 is disposed on the second conductivity type semiconductor layer 23b, and thus, the second bonding layer 59 is disposed between the first conductivity type semiconductor layer 23a and the lower common connector 53c, the lower p-connector 53b, and the upper p-electrode pad 53g. Accordingly, an electrical short circuit between the first LED stack 23 and the second LED stack 33 may be prevented, thereby preventing malfunction of the sub-pixels.

In addition, since the first transparent electrode 25 is exposed without passing through the first LED stack 23, the thickness of the first transparent electrode 25 may be form to be relatively thin, and thus, there may be no risk of damaging the first transparent electrode 25 during manufacture, thereby further stabilizing the process.

Light generated in the first LED stack 23 is emitted to the outside through the second LED stack 33 and the third LED stack 43. Accordingly, in the illustrated exemplary embodiment, the first transparent electrode 25 deviates from the emission path of light generated in the first LED stack 23, and thus, light loss due to the first transparent electrode 25 may be avoided. In this case, the first transparent electrode 25 may not need to be formed transparent.

The upper through-holes 23h1, 23h2, and 23h3 pass through the first LED stack 23. The upper through-holes 23h1, 23h2, and 23h3 may pass through the first LED stack 23, and may pass through the second bonding layer 59. The upper through-hole 23h1 exposes the upper p-electrode pad 53g, the upper through-hole 23h2 exposes the lower p-connector 53b, and the upper through-hole 23h3 exposes the lower common connector 53c. Regions of the upper p-electrode pad 53g, the lower p-connector 53b, and the lower common connector 53c exposed by the upper through-holes 23h1, 23h2, and 23h3 may be located at the same elevation as one another. Accordingly, during the formation of the upper through-holes 23h1, 23h2, 23h3 through an etching process, it may be possible to prevent components, such as the lower p-connector 53b or the lower common connector 53c, from substantially being damaged prior to another component, such as the upper p-electrode pad 53g, is exposed, thereby stabilizing the process.

The upper through-holes 23h1, 23h2, and 23h3 may be formed by removing the second conductivity type semiconductor layer 23b through mesa etching to expose the first conductivity type semiconductor layer 23a, and then by etching the exposed first conductivity type semiconductor layer 23a. More particularly, the upper through-holes 23h1, 23h2, and 23h3 may be formed in the mesa etching region of the first LED stack 23. Accordingly, sidewalls of the upper through-holes 23h1, 23h2, and 23h3 may have a stepped structure as shown in FIG. 3B. One of the mesa etching regions exposes the first conductivity type semiconductor layer 23a at a bottom thereof.

The intermediate insulation layer 61 covers the first LED stack 23 and the first transparent electrode 25, and covers sidewalls of mesa etching region and the sidewalls of the upper through-holes 23h1, 23h2, and 23h3. The intermediate insulation layer 61 may also cover side surfaces of the first to third LED stacks 23, 33, and 43. The intermediate insulation layer 61 may be patterned to have openings 61a exposing a bottom portion of each of the upper through-holes 23h1, 23h2, and 23h3. The upper p-electrode pad 53g, the lower p-connector 53b, and the lower common connector 53c may be exposed in the upper through-holes 23h1, 23h2, and 23h3 by the openings 61a. Further, the intermediate insulation layer 61 may have an opening 61b exposing the upper surface of the first LED stack 23 in the mesa etching region. In addition, the intermediate insulation layer 61 may have an opening 61c exposing the first transparent electrode 25.

The intermediate insulation layer 61 may be formed of an aluminum oxide film, a silicon oxide film, or a silicon nitride film, and may be formed to have a thickness of, for example, about 800 nm.

The first upper connector 63r, the second upper connector 63g, the third upper connector 63b, and the upper common connector 63c are disposed on the intermediate insulation layer 61. The first upper connector 63r is connected to the first transparent electrode 25 exposed through the opening 61c of the intermediate insulation layer 61. The second upper connector 63g, the third upper connector 63b, and the upper common connectors 63c are connected to the upper p-electrode pad 53g, the lower p-connector 53b, and lower common connector 53c exposed through the openings 61a, 61b, and 61c of the intermediate insulation layer 61, respectively. Furthermore, the upper common connector 63c may be connected to the first conductivity type semiconductor layer 23a exposed in the opening 61b.

The first upper connector 63r, the second upper connector 63g, the third upper connector 63b, and the upper common connector 63c may be formed of substantially the same material, for example, AuGe/Ni/Au/Ti, in the same process. In this case, AuGe may be in ohmic contact with the first conductivity type semiconductor layer 23a. AuGe may be formed to have a thickness of about 100 nm, and Ni/Au/Ti may be formed to have a thickness of about 2 μm. In some exemplary embodiments, AuTe may replace AuGe.

The upper insulation layer 71 covers the intermediate insulation layer 61, and covers the first upper connector 63r, the second upper connector 63g, the third upper connector 63b, and the upper common connector 63c. The upper insulation layer 71 may also cover the intermediate insulation layer 61 on the side surfaces of the first to third LED stacks 23, 33, and 43. The upper insulation layer 71 may have openings 71a exposing the first upper connector 63r, the second upper connector 63g, the third upper connector 63b, and the upper common connector 63c. The openings 71a of the upper insulation layer 71 may be generally disposed on flat surfaces of the first upper connector 63r, the second upper connector 63g, the third upper is connector 63b, and the upper common connector 63c. The upper insulation layer 71 may be formed of a silicon oxide film or a silicon nitride film, and may be formed thinner than the intermediate insulation layer 61, for example, about 400 nm thick.

Each of the bump pads 73r, 73g, 73b, and 73c may be disposed on the first upper connector 63r, the second upper connector 63g, and the third upper connector 63b, and the common connector 63c in the openings 71a of the upper insulation layer 71, respectively, and electrically connected thereto.

The first bump pad 73r may be electrically connected to the second conductivity type semiconductor layer 23b of the first LED stack 23 through the first upper connector 63r and the first transparent electrode 25.

The second bump pad 73g may be electrically connected to the second conductivity type semiconductor layer 33b of the second LED stack 33 through the second upper connector 63g, the upper p-electrode pad 53g, and the second transparent electrode 35.

The third bump pad 73b may be electrically connected to the second conductivity type semiconductor layer 43b of the third LED stack 43 through the third upper connector 63b, the lower p-connector 53b, the lower p-electrode pad 47b, and the third transparent electrode 45.

The common bump pad 73c may be electrically connected to the first conductivity type semiconductor layer 23a of the first LED stack 23 through the upper common connector 63c, electrically connected to the first conductivity type semiconductor layer 33a of the second LED stack 33 through the lower common connector 53c, and electrically connected to the first conductivity type semiconductor layer 43a of the third LED stack 43 through the n-electrode pad 47a.

As such, each of the first to third bump pads 73r, 73g, and 73b may be electrically is connected to the second conductivity type semiconductor layers 23b, 33b, and 43b of the first to third LED stacks 23, 33, and 43, and the common bump pad 73c may be commonly electrically connected to the first conductivity type semiconductor layers 23a, 33a, and 43a of the first to third LED stacks 23, 33, and 43.

The bump pads 73r, 73g, 73b, and 73c may be disposed in the openings 71a of the upper insulation layer 71, and upper surfaces of the bump pads 73r, 73g, 73b, and 73c may be substantially flat. The bump pads 73r, 73g, 73b, and 73c may be disposed on the flat surfaces of the first to third upper connectors 63r, 63g, and 63b, and the upper common connector 63c. The bump pads 73r, 73g, 73b, and 73c may be formed of Au/In. For example, Au may be formed to have a thickness of about 3 µm, and In may be formed to have a thickness of about 1 µm. According to an exemplary embodiment, the light emitting device 100 may be bonded to the pads of the circuit board 101 using In. However, the inventive concepts are not limited thereto, and in some exemplary embodiments, the light emitting device 100 may be bonded to the pads using Pb or AuSn of the bump pads.

In the illustrated exemplary embodiment, the upper surfaces of the bump pads 73r, 73g, 73b, and 73c are described and illustrated as being flat, but the inventive concepts are not limited thereto. For example, in some exemplary embodiments, the bump pads 73r, 73g, 73b, and 73c may have irregular upper surfaces, and some of the bump pads may be disposed on the upper insulation layer 71.

According to the illustrated exemplary embodiment, the first LED stack 23 is electrically connected to the bump pads 73r and 73c, the second LED stack 33 is electrically connected to the bump pads 73g and 73c, and the third LED stack 43 is electrically connected to the bump pads 73b and 73c. Accordingly, cathodes of the first LED stack 23, the second LED stack 33, and the third LED stack 43 are electrically connected to the common bump pad 73c, and anodes thereof are electrically connected to the first to third bump pads 73r, 73b, and 73g, respectively. Accordingly, the first to third LED stacks 23, 33, and 43 may be driven independently.

Figure 4A:
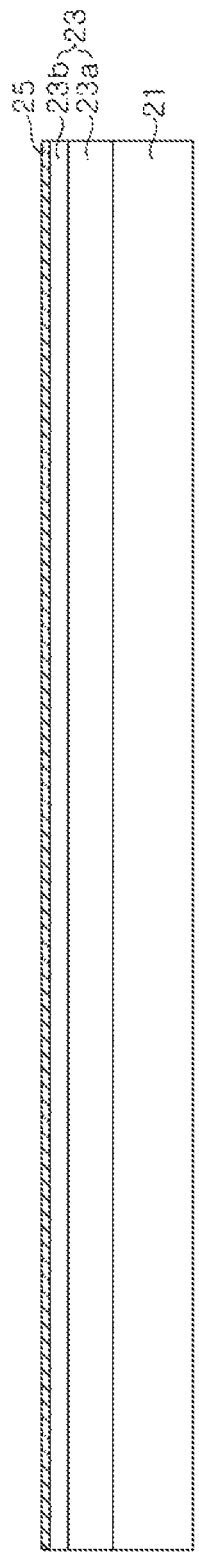
FIG. 4A, FIG. 4B, and FIG. 4C are schematic cross-sectional views illustrating first, second, and third LED stacks grown on a growth substrate, respectively, according to an exemplary embodiment.
Figure 4B:
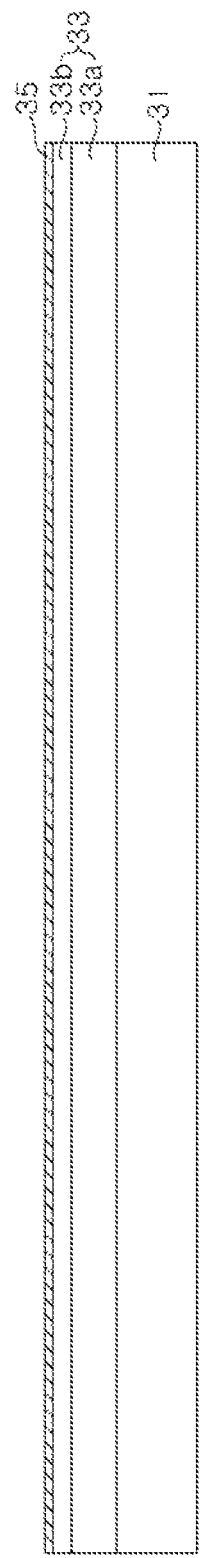
Figure 4C:
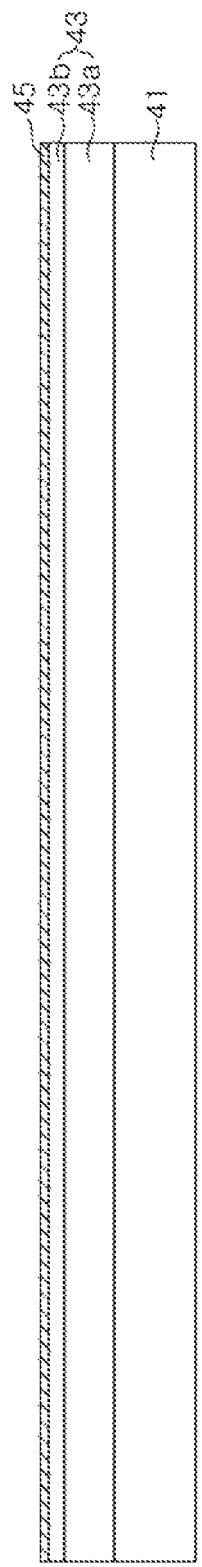

A structure of the light emitting device 100 will be further described through a method of manufacturing the light emitting device 100 described below. FIG. 4A, FIG. 4B, and FIG. 4C are schematic cross-sectional views illustrating the first to third LED stacks grown on growth substrates, respectively, according to an exemplary embodiment.

First, referring to FIG. 4A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that may transmit light generated by the first LED stack 23, for example, red light. The first transparent electrode 25 may be formed of, for example, indium-tin oxide (ITO).

Referring to FIG. 4B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a GaN substrate, or a GaAs substrate. The first conductivity type semiconductor layer 33a and the second conductivity type semiconductor layer 33b may be formed of an AlGaInAs-based or AlGaInP-based semiconductor layer, an AlGaInN-based semiconductor layer, and the active layer may include, for example, an AlGaInP-based well layer or AlGaInN-based well layer. A composition ratio of AlGaInP or AlGaInN may be determined so that the second LED stack 33 emits green light, for example.

A second transparent electrode 35 may be formed on the second conductivity type semiconductor layer 33b. As described above, the second transparent electrode 35 may be formed of a metal layer or a conductive oxide layer that may transmit light generated by the first LED stack 23, for example, red light. In particular, the second transparent electrode 35 may be formed of ZnO.

Referring to FIG. 4C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a SiC substrate, or a GaN substrate. In an exemplary embodiment, the third substrate 41 may be a flat sapphire substrate, but may also be a patterned sapphire substrate. The first conductivity type semiconductor layer 43a and the second conductivity type semiconductor layer 43b may be formed of an AlGaInN-based semiconductor layer, and the active layer may include, for example, an AlGaInN-based well layer. A composition ratio of AlGaInN may be determined so that the third LED stack 43 emits blue light, for example.

A third transparent electrode 45 may be formed on the second conductivity type semiconductor layer 43b. As described above, the third transparent electrode 45 may be formed of a metal layer or a conductive oxide layer that may transmit light generated in the first and second LED stacks 23 and 33, for example, red light and green light. In particular, the third transparent electrode 45 may be formed of ZnO.

The first to third LED stacks 23, 33, and 43 are grown on the different growth substrates 21, 31, and 41, respectively, and, accordingly, the order of the manufacturing process not particularly limited.

Hereinafter, a method of manufacturing the light emitting device 100 using the first to third LED stacks 23, 33, and 43 grown on the growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, and 13D are schematic plan views and cross-sectional views illustrating the method of manufacturing the light emitting device 100 for a display according to an exemplary embodiment of the present disclosure. Hereinafter, the cross-sectional views are shown to correspond to those shown in FIGS. 3B, 3C, and 3D, respectively.

Figure 5A:
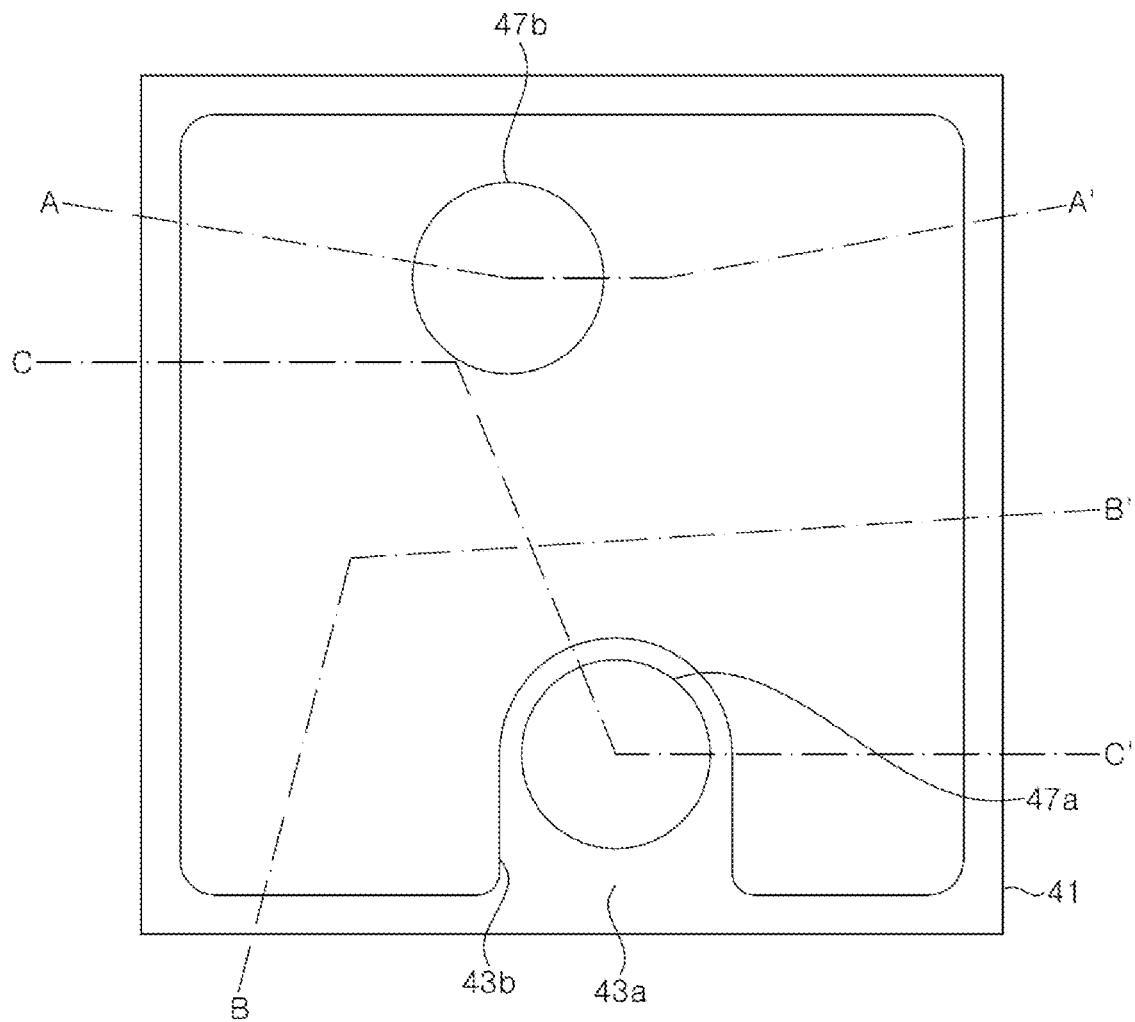

First, referring to FIG. 5A, FIG. 5B, FIG. 5C, and FIG. 5D, the third transparent electrode 45 and the second conductivity type semiconductor layer 43b of the third LED stack 43 are patterned to expose the first conductivity type semiconductor layer 43a using photolithography and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 5A exemplarily shows an edge of the mesa, and does not show an edge of the third transparent electrode 45 to simplify illustrating. However, since the third transparent electrode 45 is wet etched using the same etching mask, it can be easily understood that the edge of the third transparent electrode 45 may also be recessed from the edge of the mesa toward an inner side of the mesa. Since the same etching mask is used, the number of photo processes is not increased, thereby reducing the process cost. However, the inventive concepts are not limited thereto, and the etching mask for etching the mesa etching process may be different from the etching mask for etching the third transparent electrode 45.

Subsequently, an n-electrode pad 47a and a lower p-electrode pad 47b are formed on the first conductivity type semiconductor layer 43a and the third transparent electrode 45, respectively. The n-electrode pad 47a and the lower p-electrode pad 47b may be formed to have different thicknesses. In particular, an upper surface of the n-electrode pad 47a and that of the lower p-electrode pad 47b may be located at substantially the same elevation.

Figure 5B:
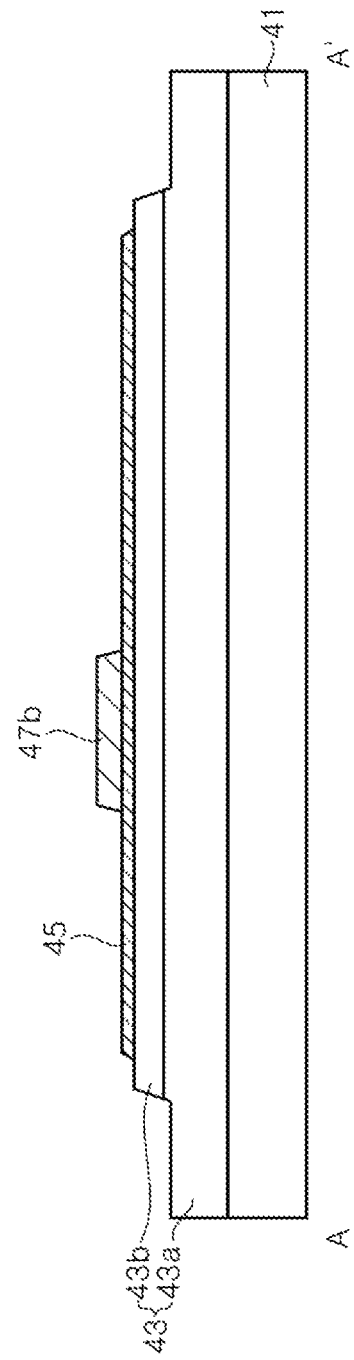
Figure 5C:
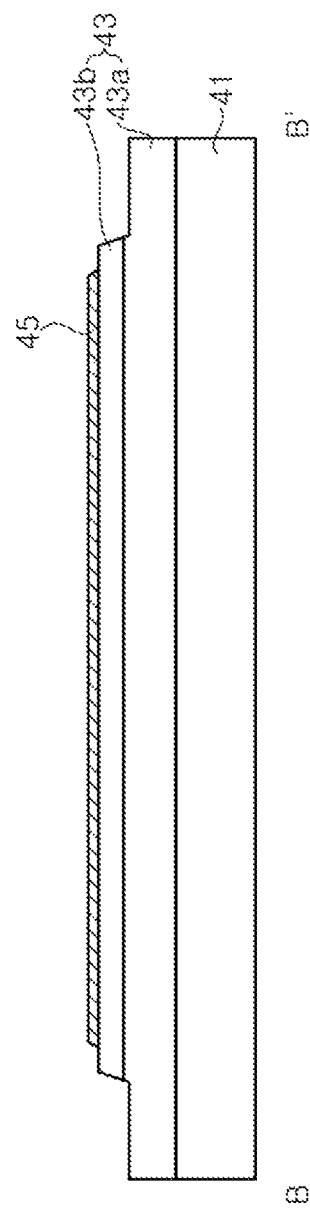
Figure 5D:
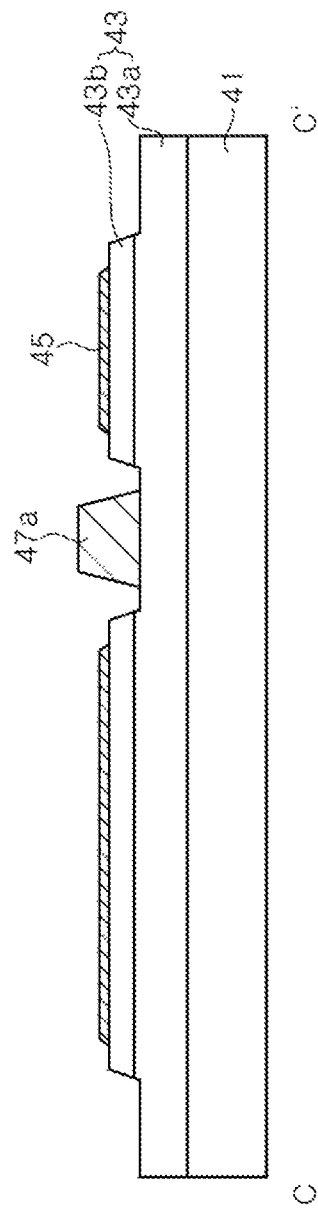

Referring to FIG. 6A, FIG. 6B, FIG. 6C, and FIG. 6D, the second LED stack 33 shown in FIG. 4B is bonded onto the third LED stack 43 described with reference to FIG. 5B, FIG. 5C, and FIG. 5D. The second LED stack 33 is bonded to a temporary substrate using a temporary bonding/debonding (TBDB) technique, and the second substrate 31 is removed first from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43, and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique, for example. Accordingly, the second LED stack 33 may be disposed on the third LED stack 43, in which the second transparent electrode 35 may form an upper surface.

In general, when the second transparent electrode 35 is formed of ITO, ITO may be peeled from the second LED stack 33 when the second substrate 31 is removed using the laser lift off technique. As such, when the second substrate 31 is to be removed using the laser lift-off technique, the second transparent electrode 35 may include ZnO, which has a favorable bonding force.

Subsequently, the second transparent electrode 35 and the second conductivity type semiconductor layer 33b are patterned to expose the first conductivity type semiconductor layer 33a. The second transparent electrode 35 and the second conductivity type semiconductor layer 33b may be patterned using photolithography and etch techniques. This process may be performed using the wet etching and the dry etching techniques in substantially the same manner as the mesa etching process, during which the third transparent electrode 45 and the second conductivity type semiconductor layer 43b are etched, as described above.

Figure 6A:
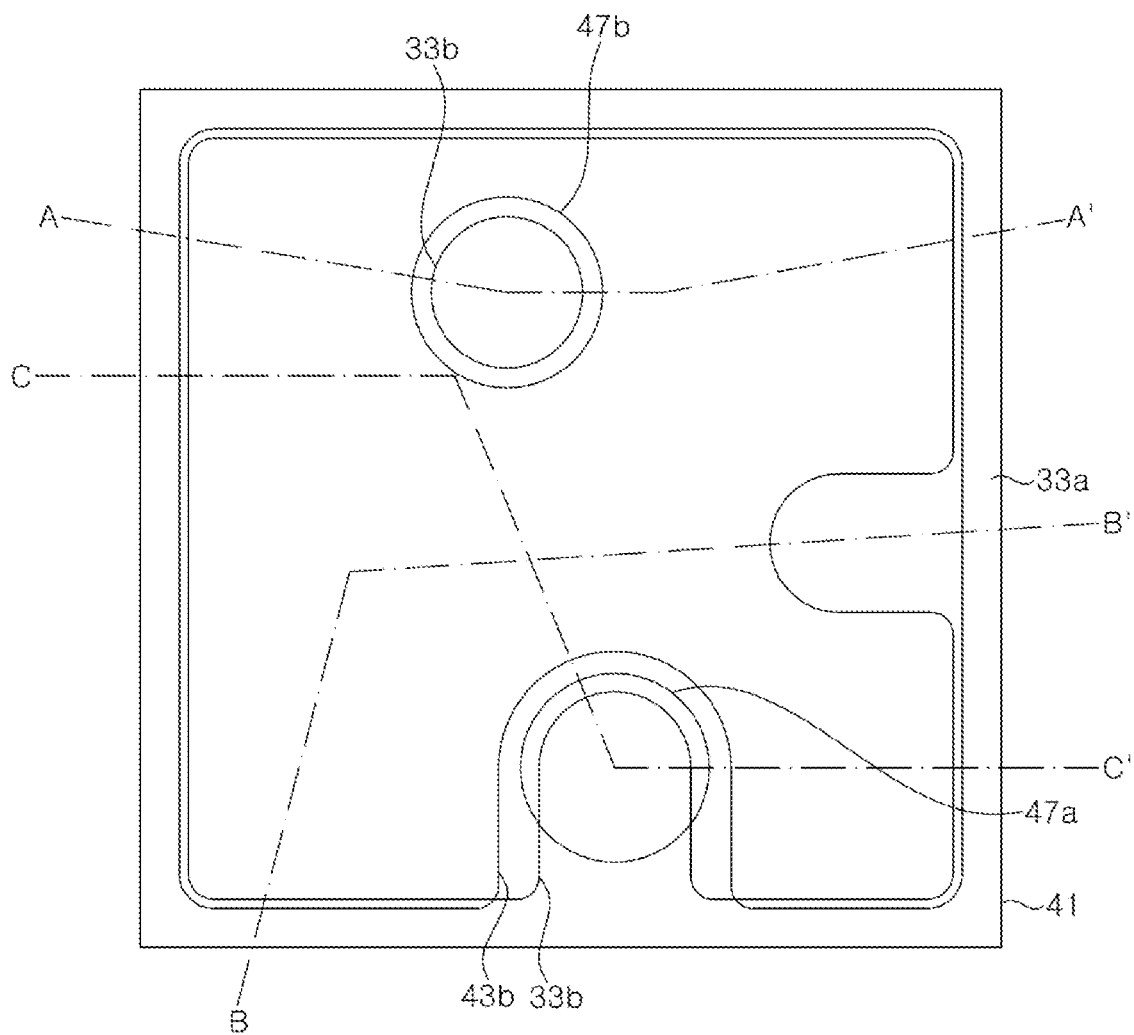
Figure 6B:
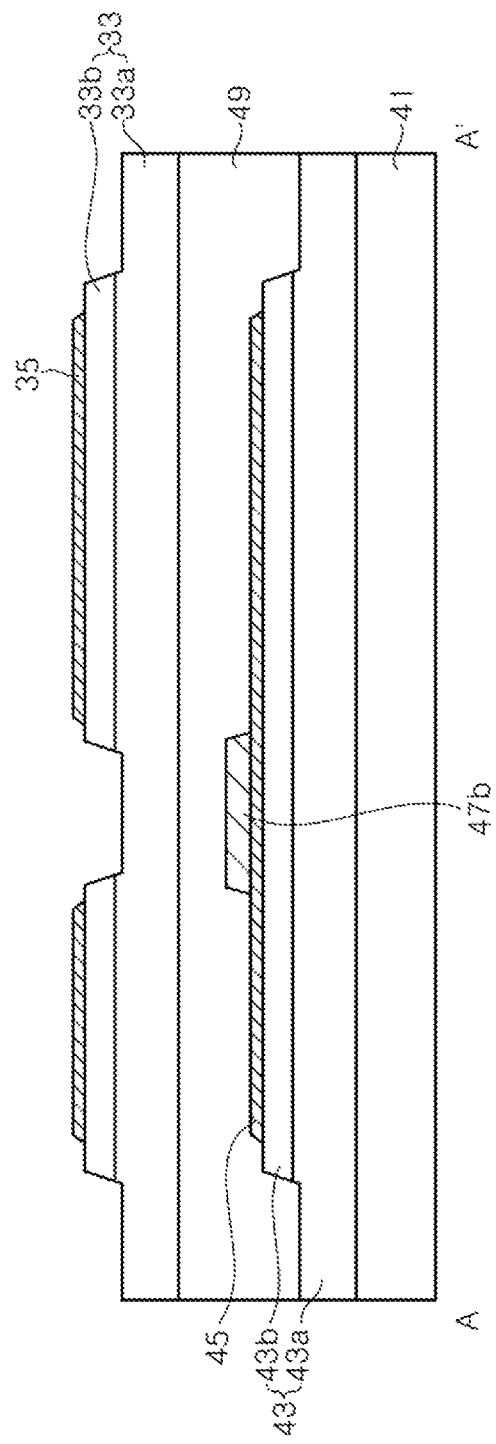
Figure 6D:
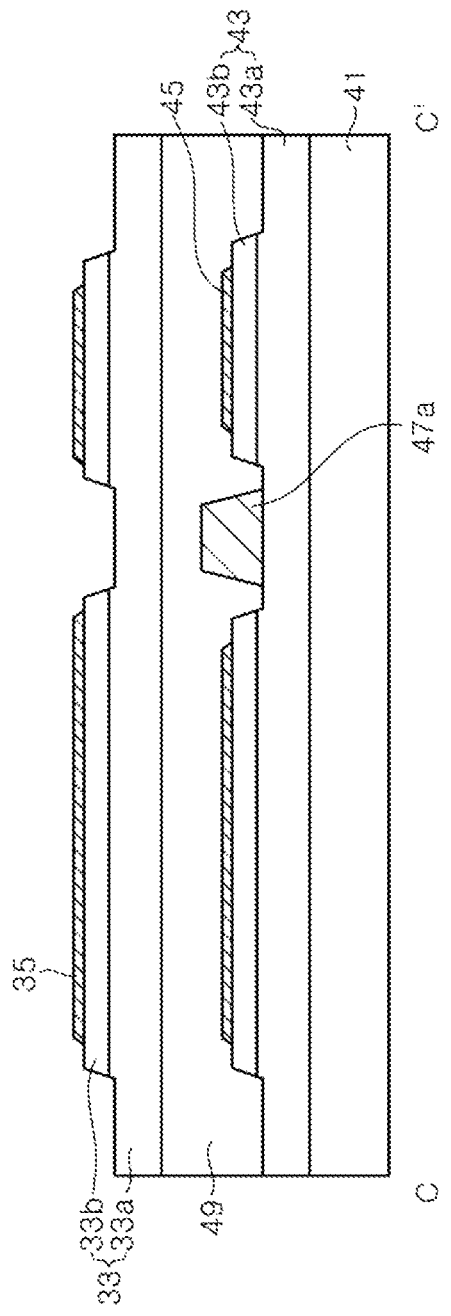
Figure 7A:
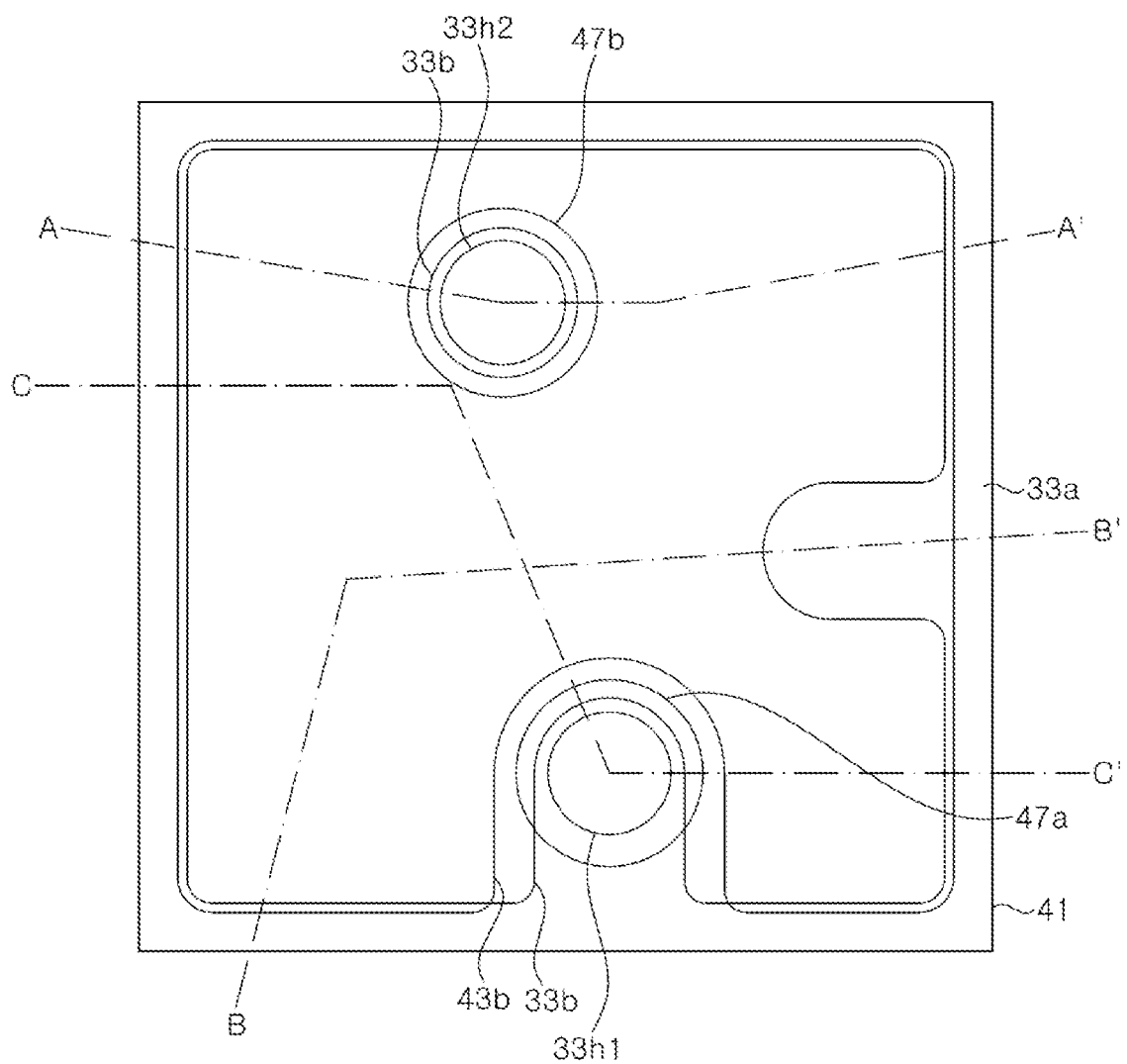
Figure 7B:
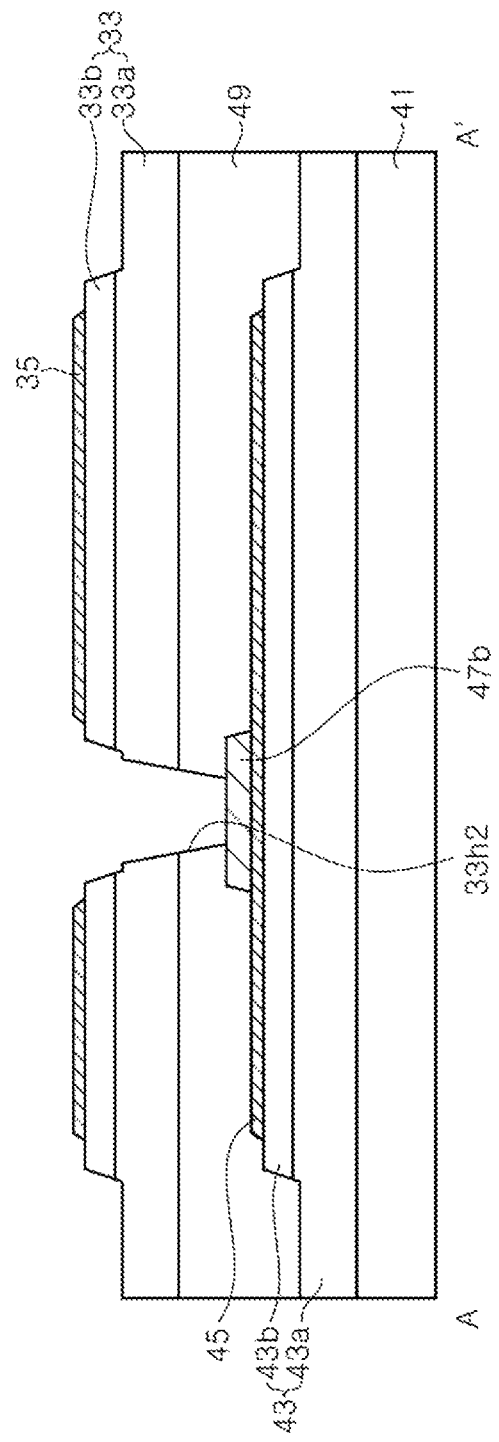
Figure 7C:
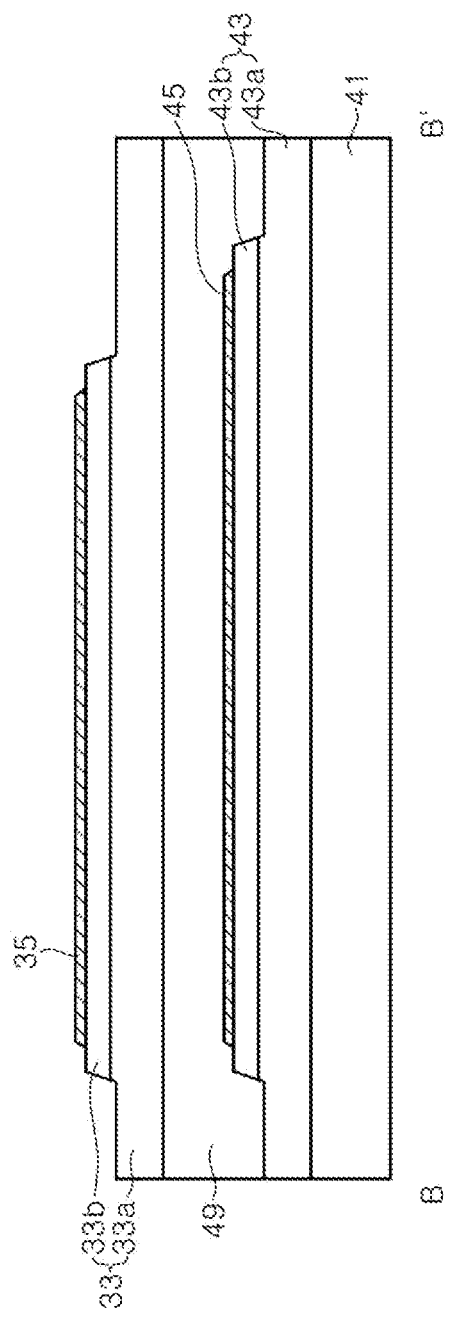
Figure 7D:
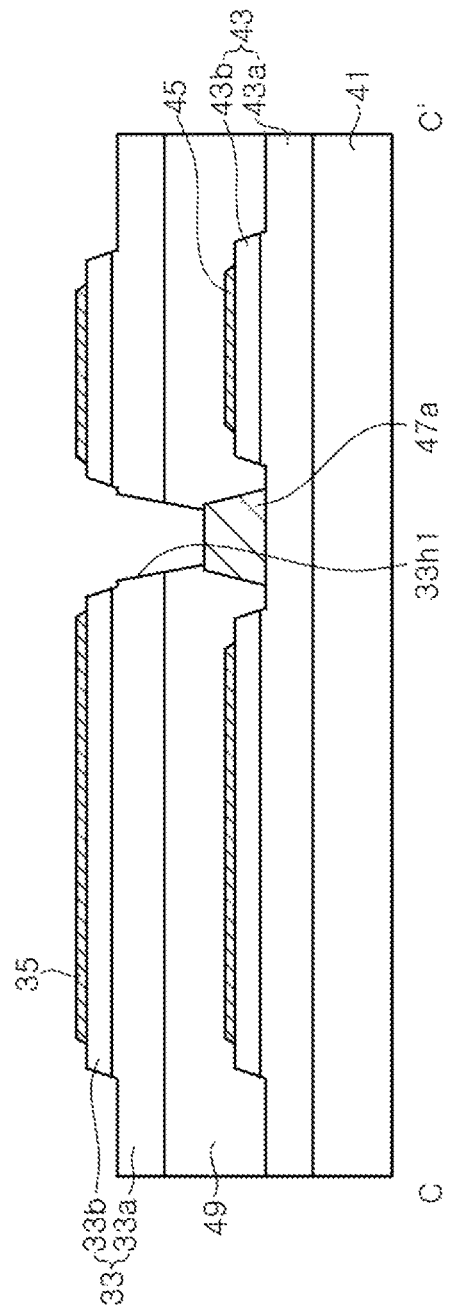
Figure 8A:
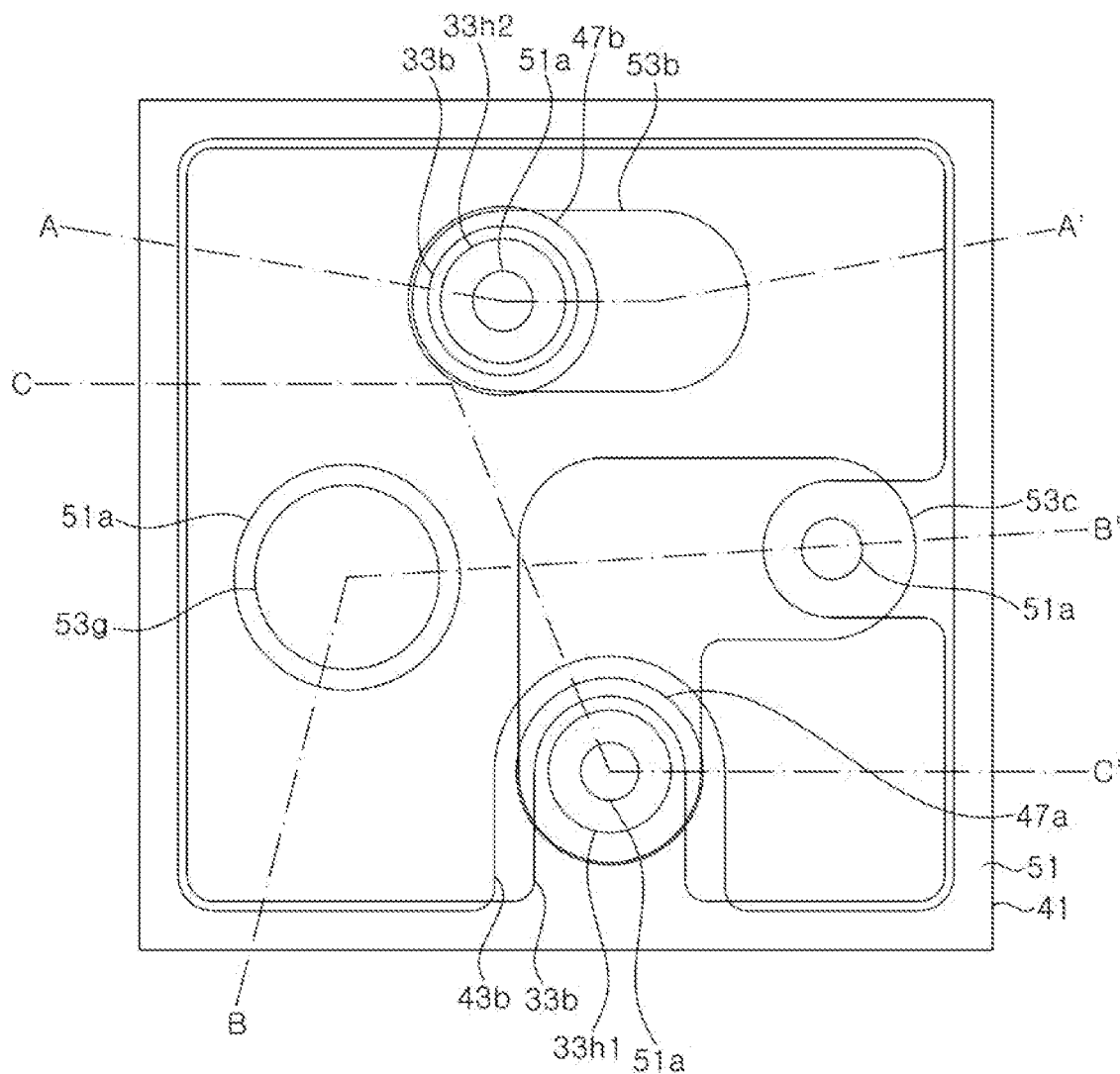
Figure 8B:
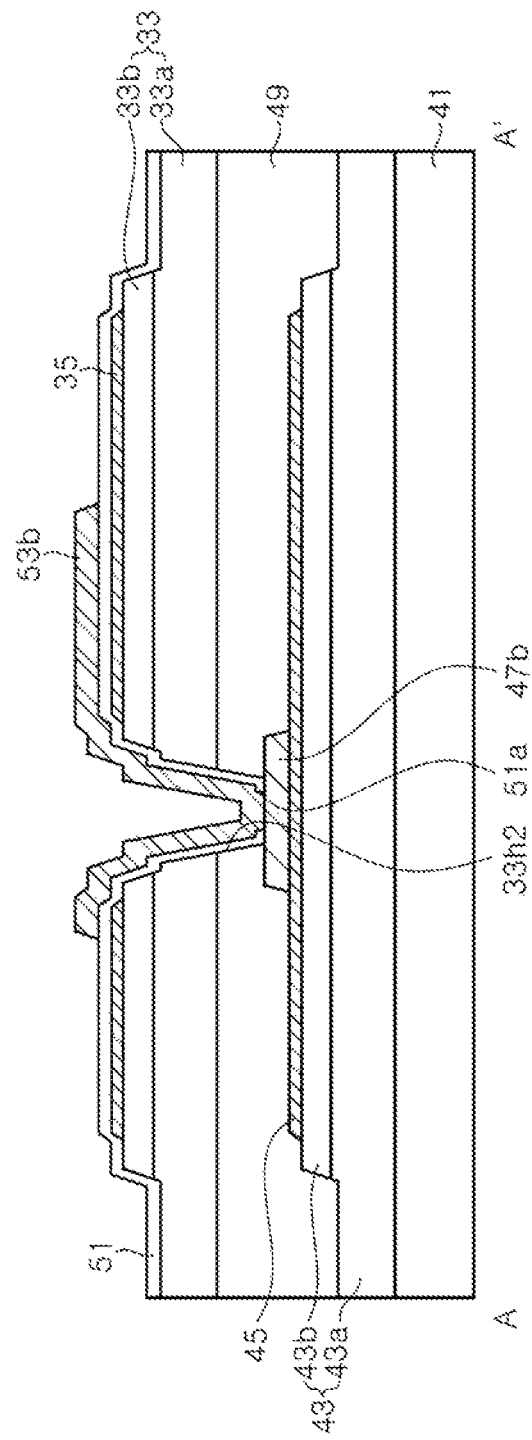
Figure 8C:
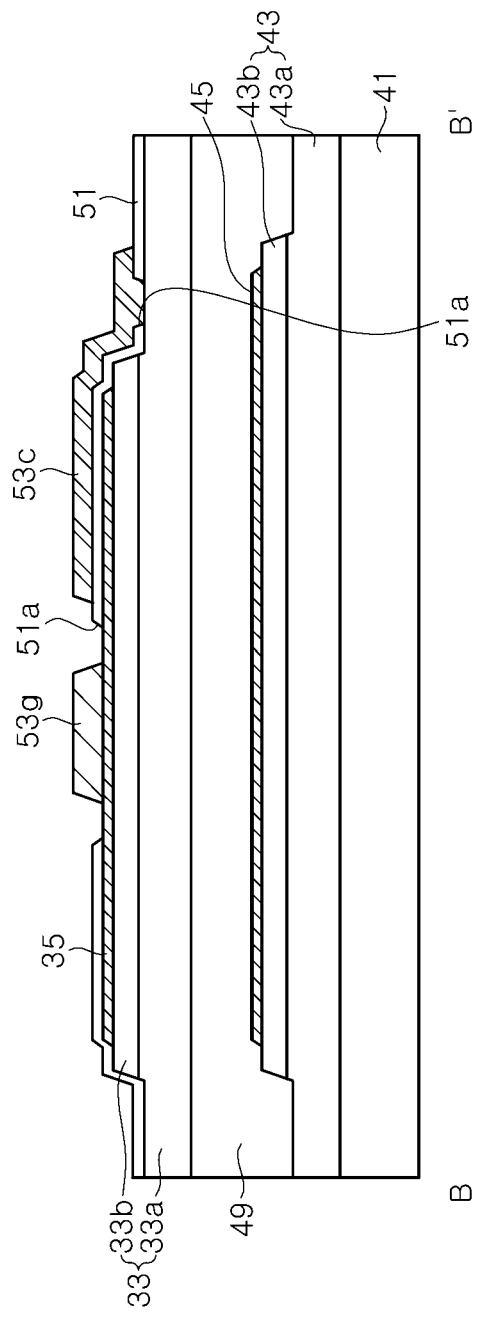
Figure 8D:
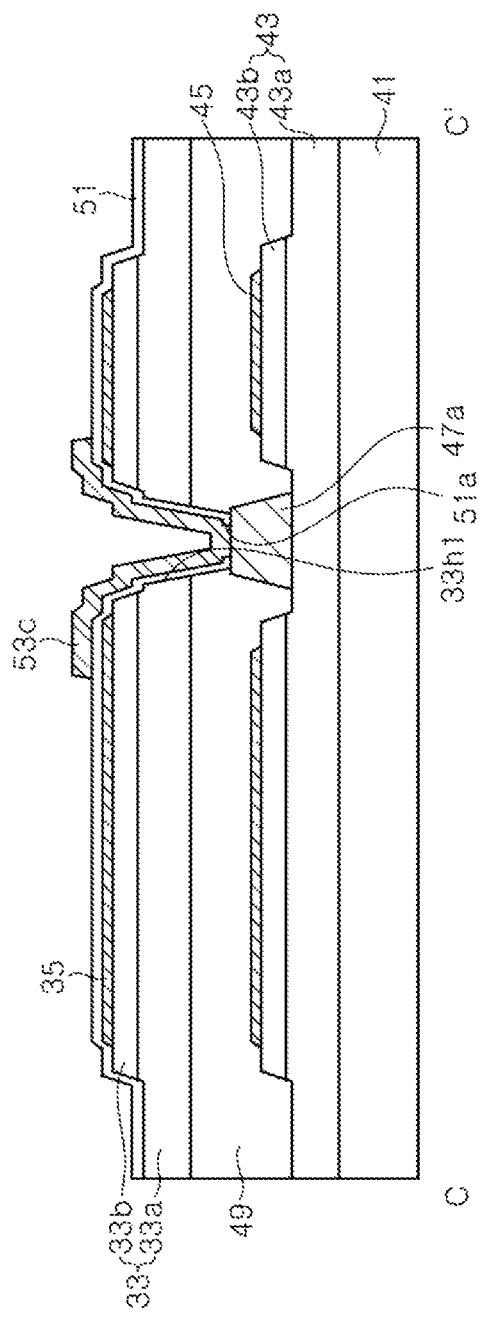

For example, after the etching mask is formed, the second transparent electrode 35 may be etched first by the wet etching technique, and then the second conductivity type semiconductor layer 33b may be etched by the dry etching technique using the same etching mask. Accordingly, the second transparent electrode 35 may be recessed from the mesa etching region. FIG. 6A exemplarily shows an edge of the mesa and does not show an edge of the second transparent electrode 35 to simplify illustration. However, since the second transparent electrode 35 is wet etched using the same etching mask, the edge of the second transparent electrode 35 may also be recessed from the edge of the mesa toward an inner side of the mesa. In this manner, since the same etching mask is used, the number of photo processes may not be increased, thereby reducing the process cost. However, the inventive concepts are not limited thereto, and in some exemplary embodiments, the etching mask for etching the mesa etching process and the etching mask for etching the second transparent electrode 35 may be different from each other.

As shown in FIG. 6A, a mesa etching region of the second LED stack 33 may be partially overlapped with that of the third LED stack 43. For example, a portion of the mesa etching region of the second LED stack 33 may be formed over the n-electrode pad 47a. In addition, another portion of the mesa etching region thereof may be disposed over the lower p-electrode pad 47b. In addition to this, a portion of the mesa etching region of the second LED stack 33 may be disposed on the mesa region of the third LED stack 43.

Referring to FIG. 7A, FIG. 7B, FIG. 7C, and FIG. 7D, lower through-holes 33h1 and 33h2 passing through the second LED stack 33 are formed. The lower through-holes 33h1 and 33h2 pass through the first bonding layer 49 to expose the n-electrode pad 47a and the lower p-electrode pad 47b. The lower through-holes 33h1 and 33h2 may be formed in the mesa etching region, and thus, a stepped structure may be formed on sidewalls of the lower through-holes 33h1 and 33h2.

Since the upper surfaces of the lower p-electrode pad 47b and the n-electrode pad 47a are located at substantially the same elevation, any one of the pads may be prevented from being exposed and damaged during the formation of the lower through-holes 33h1 and 33h2.

Referring to FIG. 8A, FIG. 8B, FIG. 8C, and FIG. 8D, a lower insulation layer 51 is formed on the second LED stack 33. The lower insulation layer 51 covers the second transparent electrode 35, and covers the second conductivity type semiconductor layer 33b. In addition, the lower insulation layer 51 covers the sidewalls of the lower through-holes 33h1 and 33h2. The lower insulation layer 51 may have openings 51a exposing the second transparent electrode 35, the first conductivity type semiconductor layer 33a, the n-electrode pad 47a, and the lower p-electrode pad 47b.

Subsequently, a lower common connector 53c, a lower p-connector 53b, and an upper p-electrode pad 53g are formed on the lower insulation layer 51. The lower common connector 53c, the lower p-connector 53b, and the upper p-electrode pad 53g may be formed together with the same material. However, the inventive concepts are not limited thereto, and in some exemplary embodiments, the lower common connector 53c, the lower p-connector 53b, and the upper p-electrode pad 53g may be formed with different materials in different processes. For example, the upper p-electrode pad 53g may be formed thicker so that the elevation of the upper surface of the upper p-electrode pad 53g is equal to the elevation of the upper surface of the lower p-connector 53b or the lower common connector 53c.

The upper p-electrode pad 53g may be disposed on the second transparent electrode 35 exposed by the opening 51a. Furthermore, a portion of the upper p-electrode pad 53g may be formed to be disposed on the lower insulation layer 51.

The lower p-connector 53b is connected to the lower p-electrode pad 47b exposed through the opening 51a, and is also partially disposed on the lower insulation layer 51. The lower common connector 53c is connected to the first conductivity type semiconductor layer 33a and the n-electrode pad 47a exposed through the openings 51a, and a portion of the lower common connector 53c is disposed on the lower insulation layer 51.

Referring to FIG. 9A, FIG. 9B, FIG. 9C and FIG. 9D, the first LED stack 23 of FIG. 4A is bonded to the second LED stack 33. The first LED stack 23 is bonded to a temporary substrate using a temporary bonding/debonding (TBDB) technique, and the first substrate 21 is removed first from the first LED stack 23. The first substrate 21 may be removed using, for example, wet or dry etching techniques. After the first substrate 21 is removed, semiconductor layers that absorb light generated in the second LED stack 33 may also be removed. Subsequently, a roughened surface may be formed on the exposed surface of the first conductivity type semiconductor layer 33a. Thereafter, the first conductivity type semiconductor layer 23a of the first LED stack 23 bonded to the temporary substrate may be disposed to face the second LED stack 33, and bonded to the second LED stack 33. The first LED stack 23 and the second LED stack 33 are bonded to each other by a second bonding layer 59. After bonding the first LED stack 23, the temporary substrate may be removed using the laser lift off technique, for example. Accordingly, the first LED stack 23 may be disposed on the second LED stack 33 in a form in which the first transparent electrode 25 is disposed on an upper surface thereof.

Accordingly, the second bonding layer 59 is in contact with the first conductivity type semiconductor layer 23, also in contact with the lower insulation layer 51, the lower p-connector 53b, the upper p-electrode pad 53g, and the lower common connector 53c, and, further, in contact with the second transparent electrode 35 exposed in the periphery of the upper p-electrode pad 53g.

Subsequently, the first transparent electrode 25 and the second conductivity type semiconductor layer 23b are patterned to expose the first conductivity type semiconductor layer 23a. The first transparent electrode 25 and the second conductivity type semiconductor layer 23b may be patterned using photolithography and etch techniques. This process may be performed using the wet etching and dry etching techniques in substantially the same manner as the mesa etching process, in which the third transparent electrode 45 and the second conductivity type semiconductor layer 43b are etched.

Figure 9A:
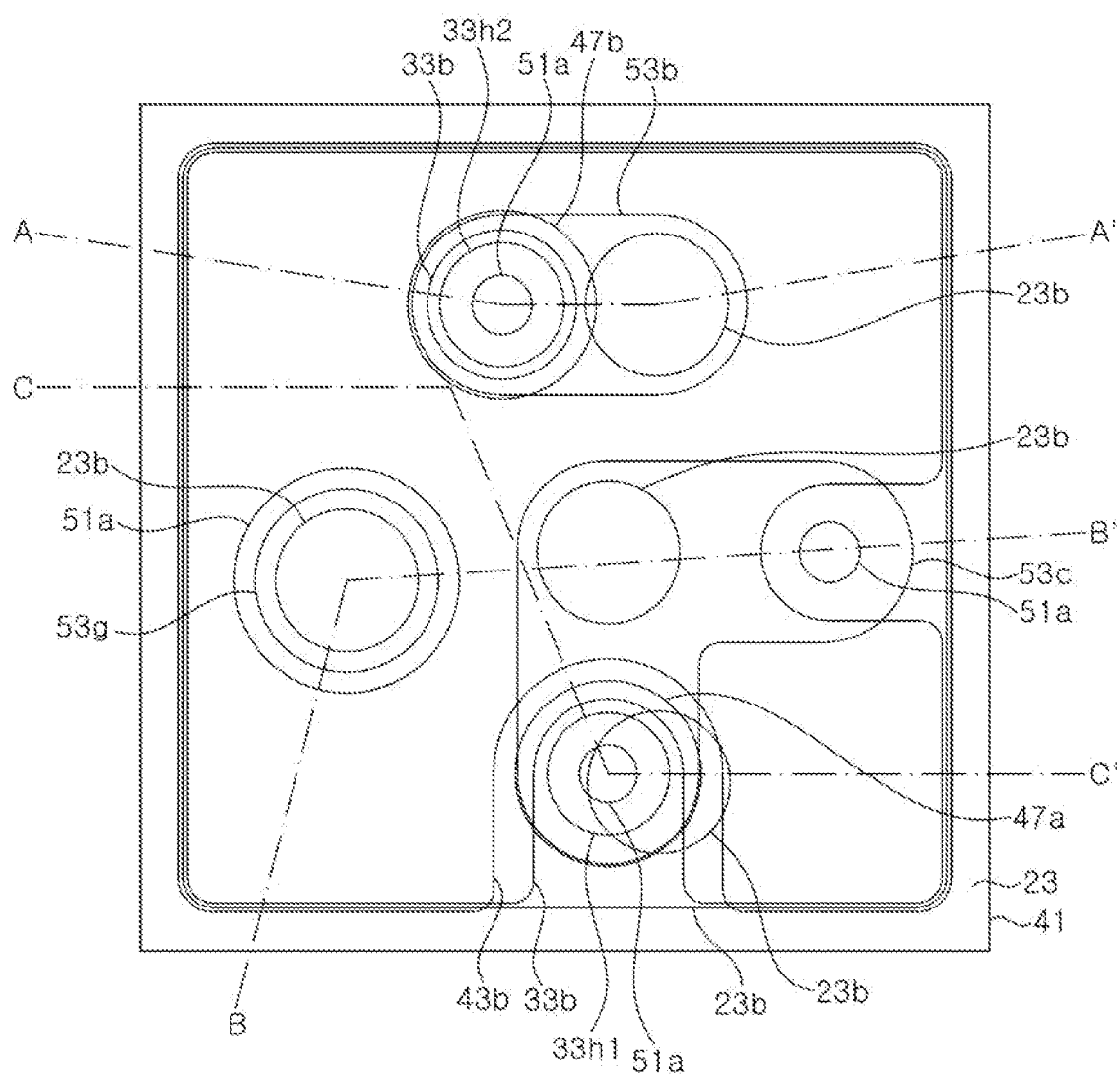
Figure 9B:
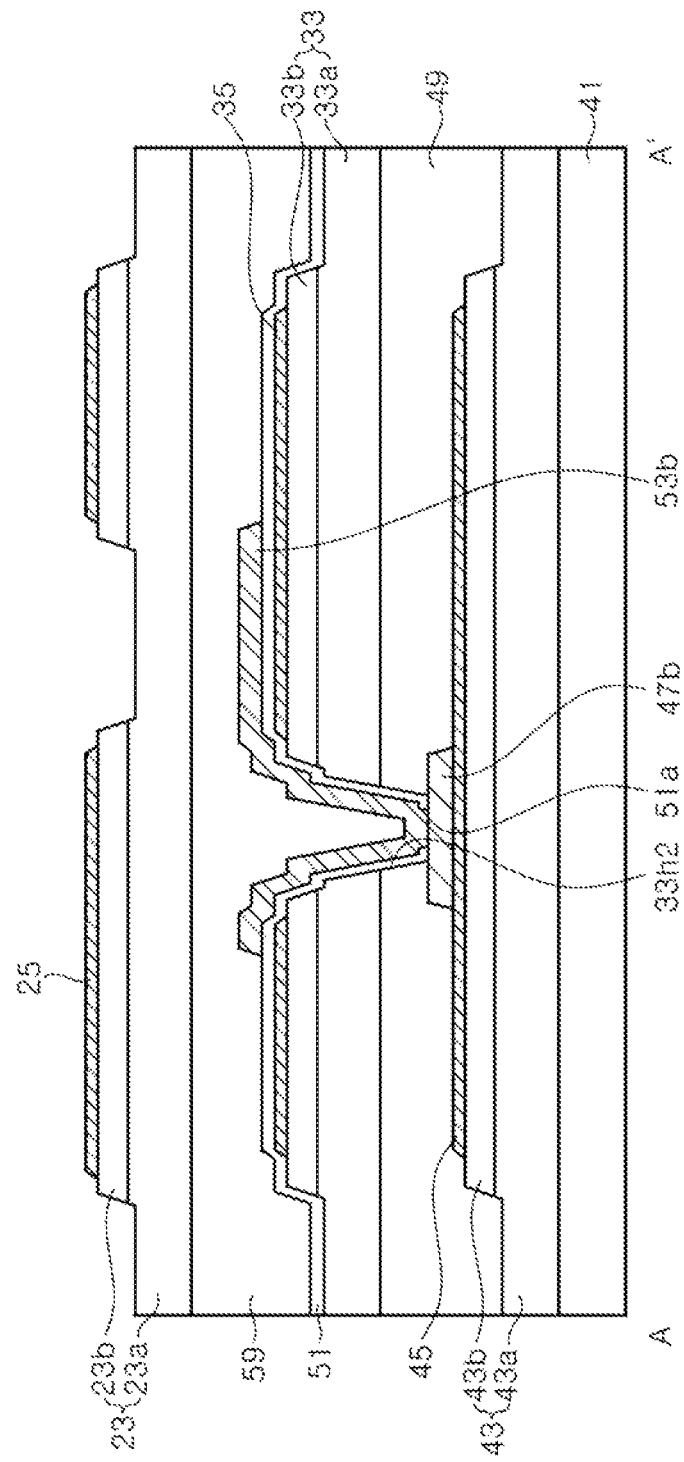
Figure 9C:
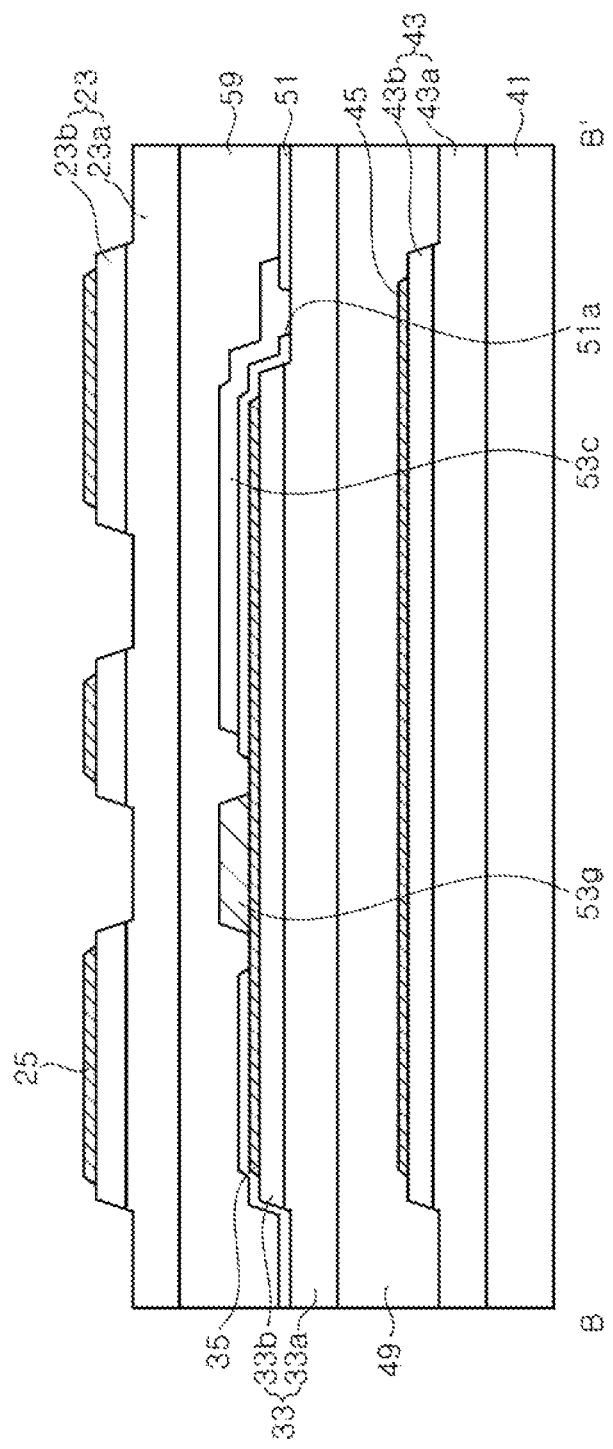
Figure 9D:
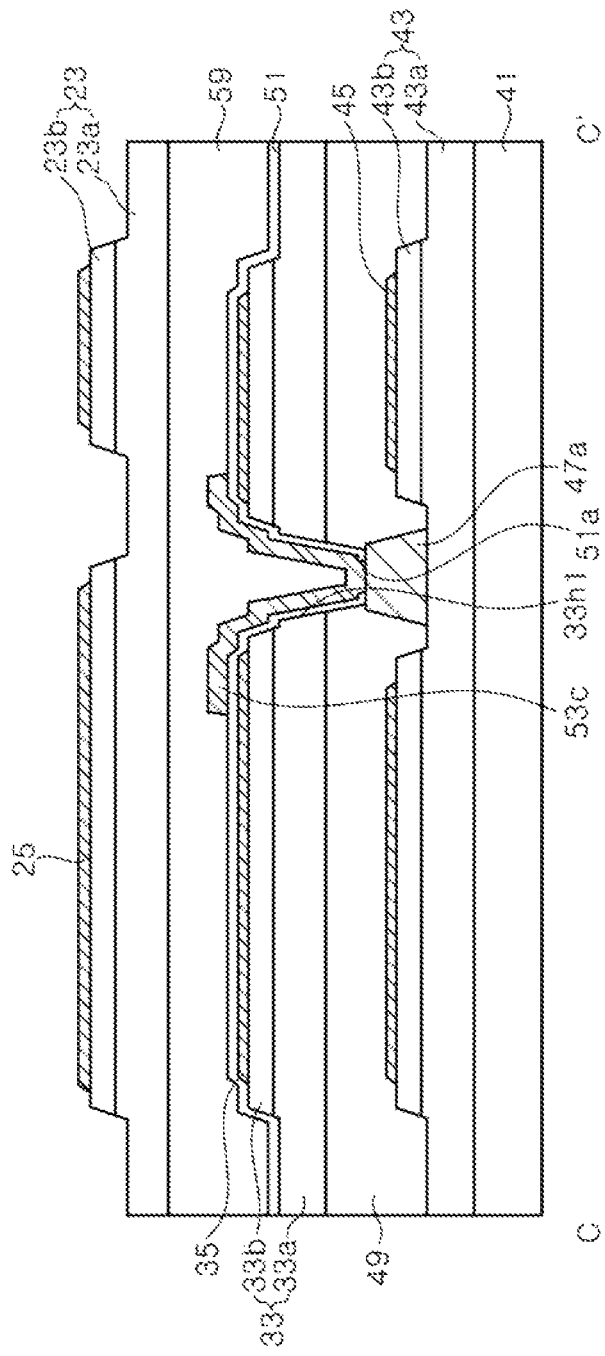
Figure 10A:
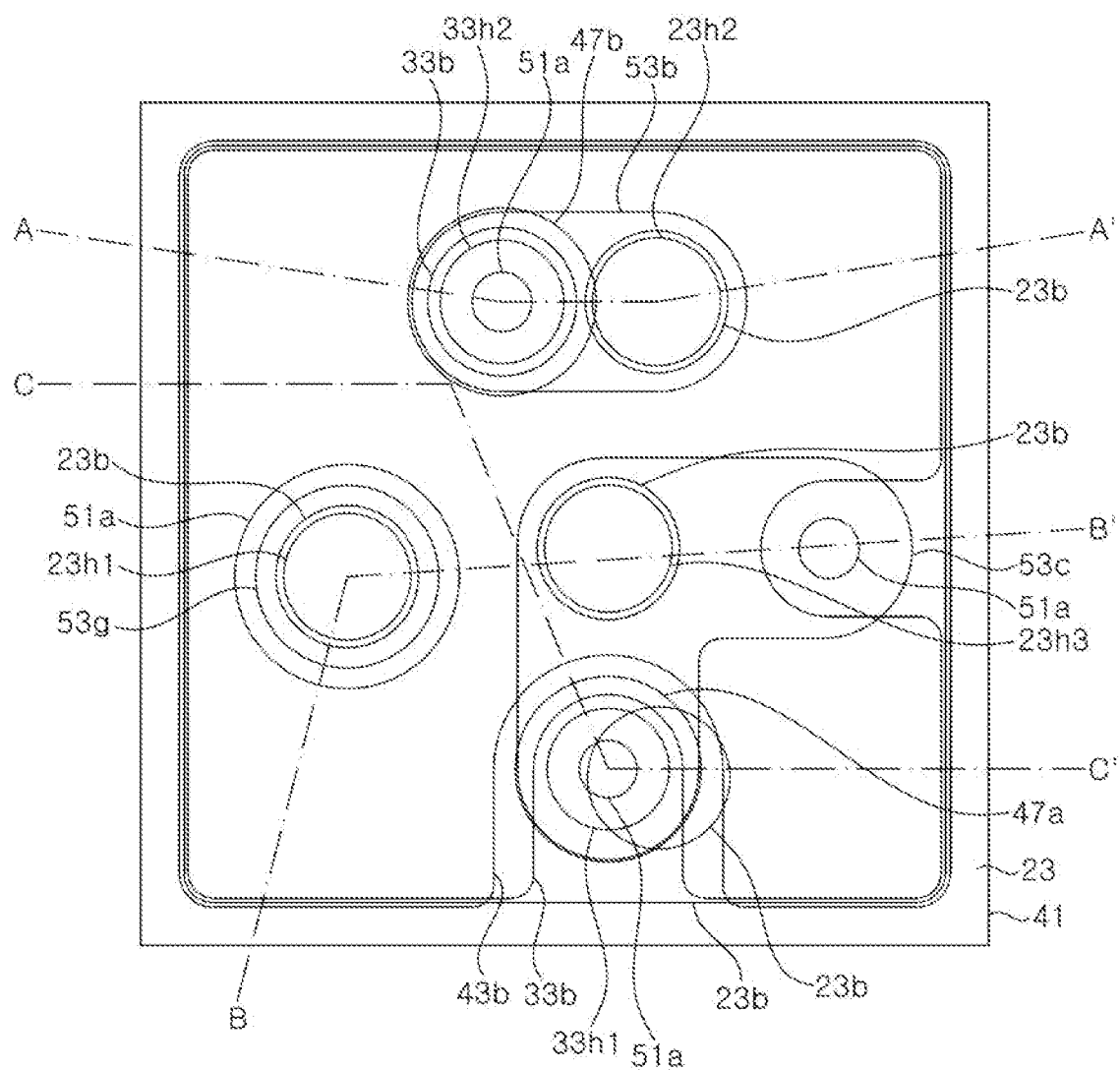
Figure 10B:
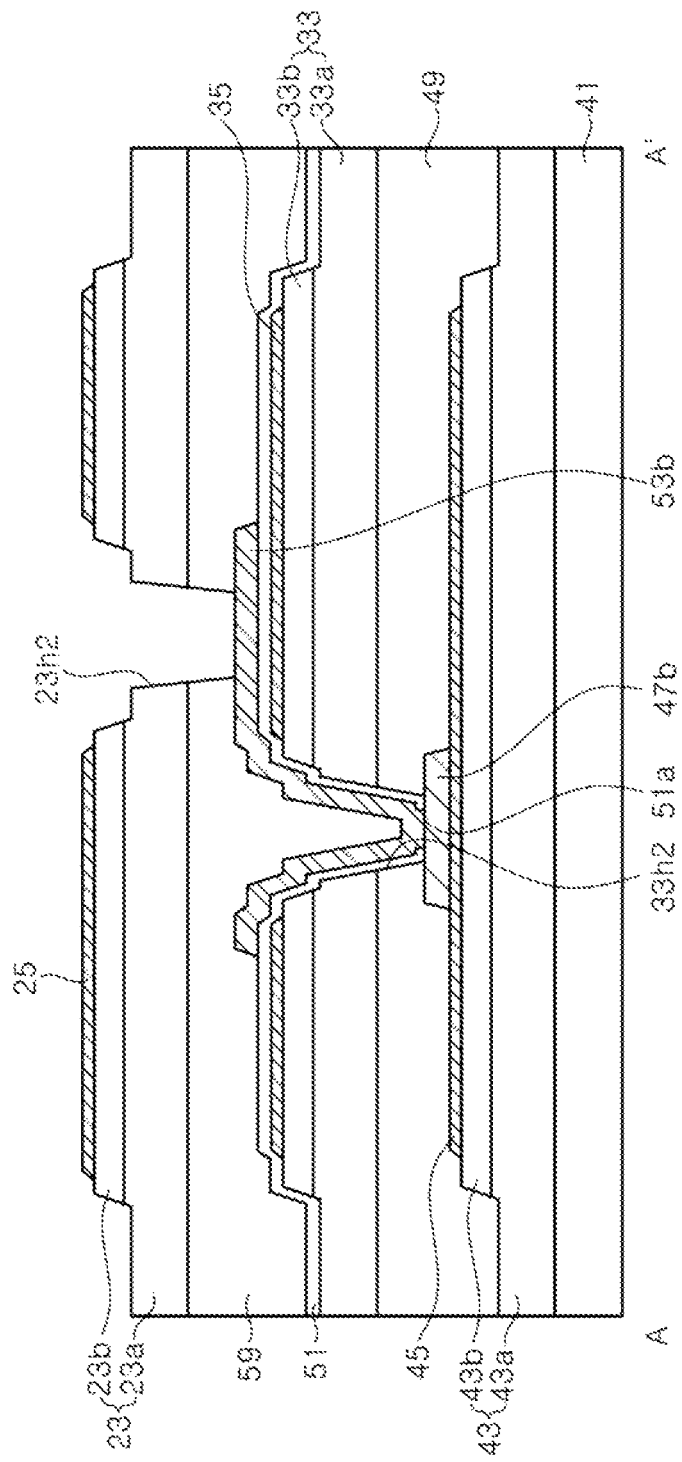
Figure 10C:
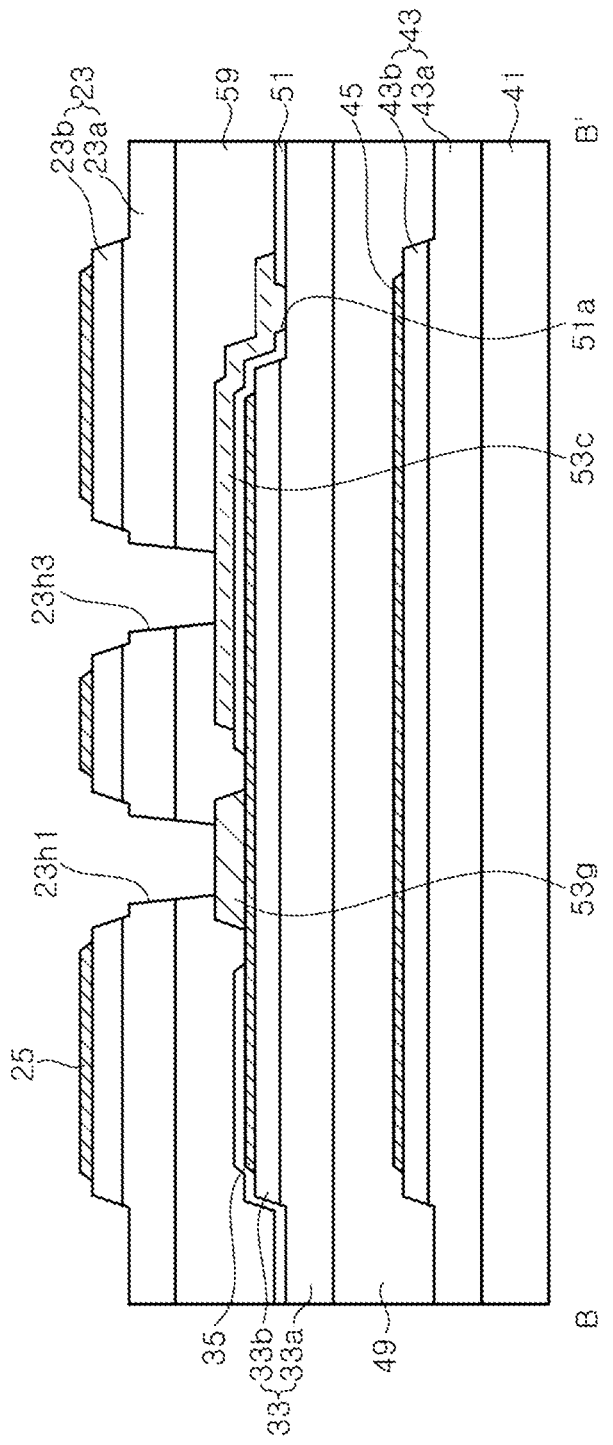
Figure 10D:
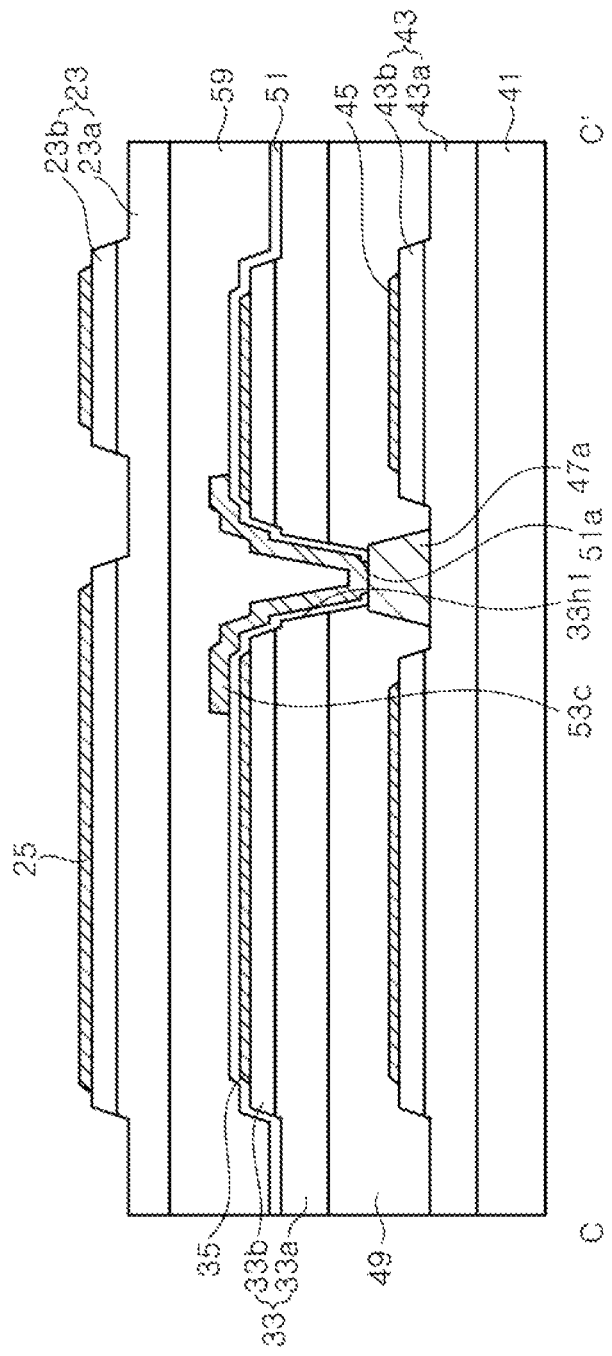
Figure 11A:
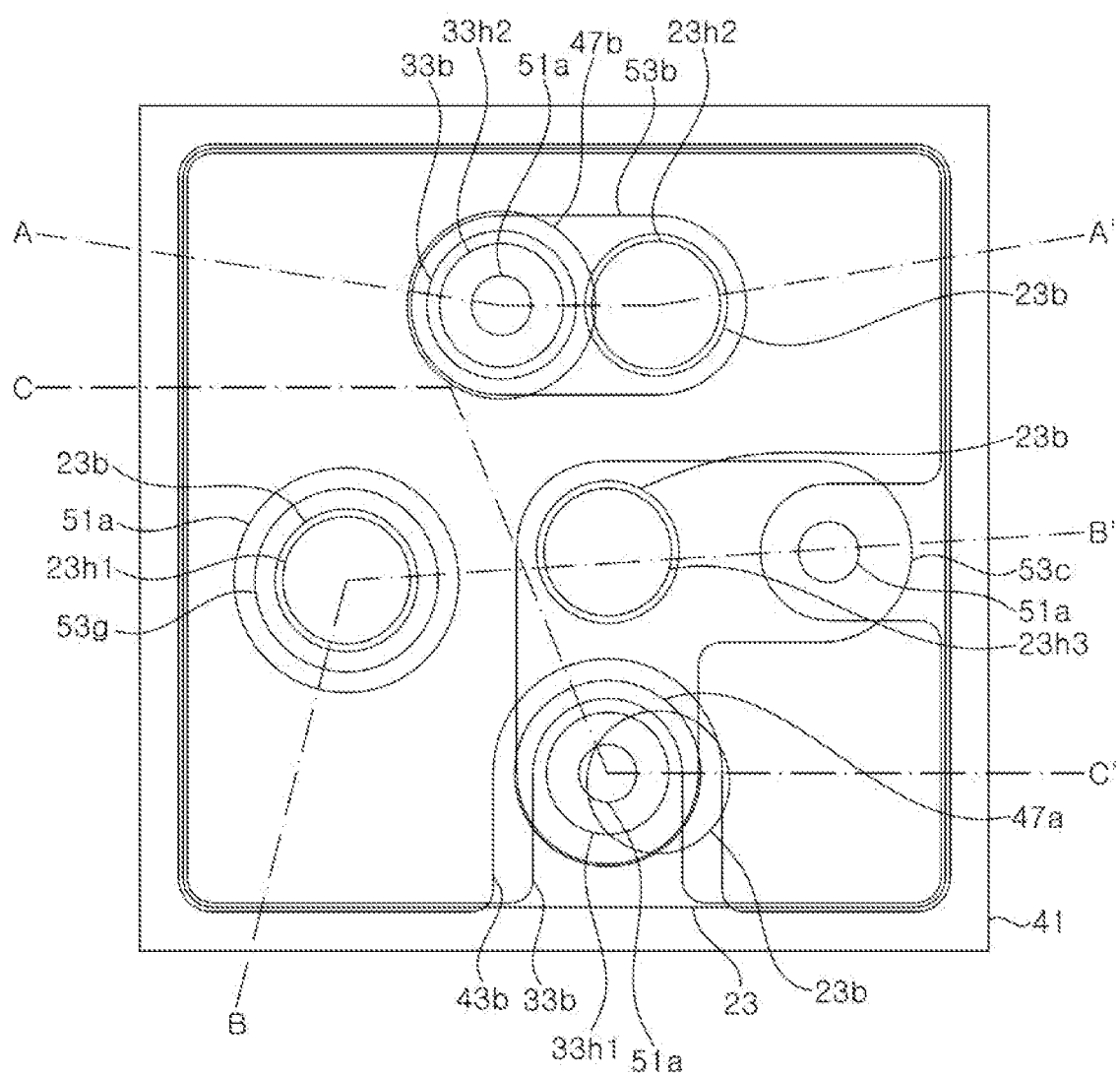
Figure 11B:
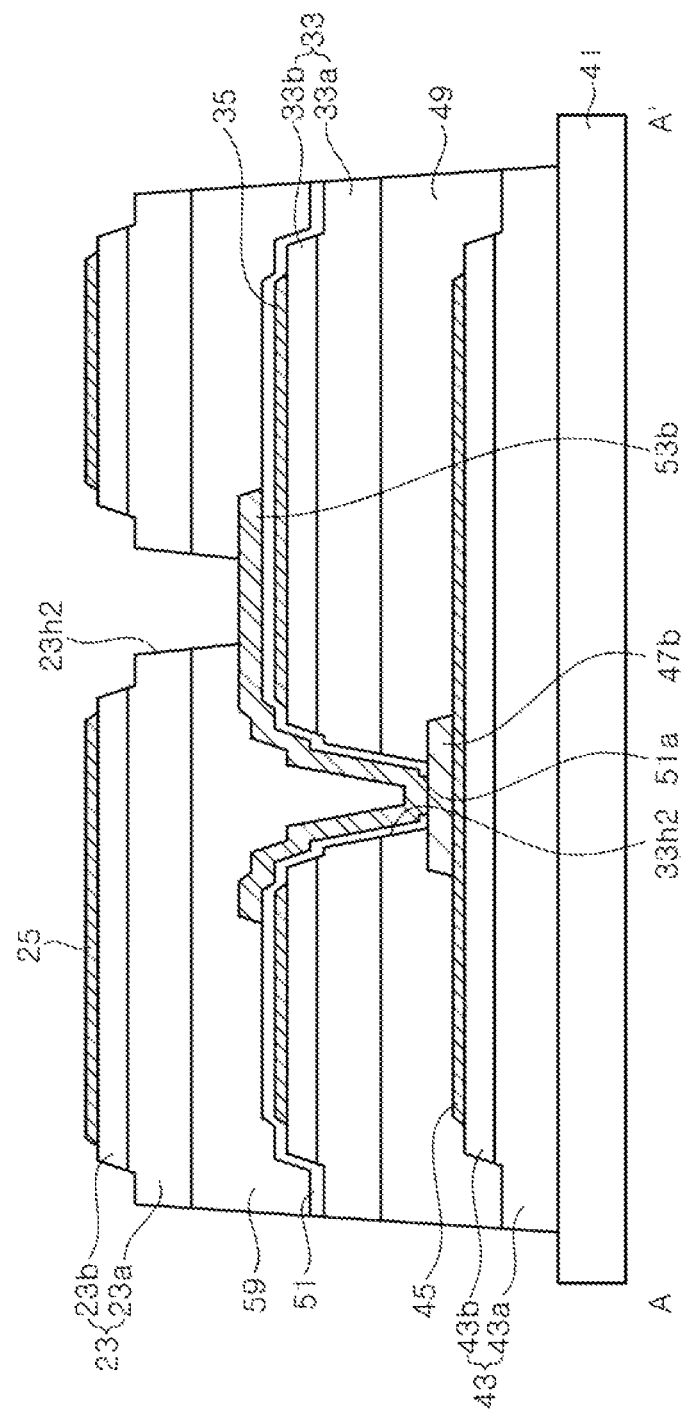
Figure 11C:
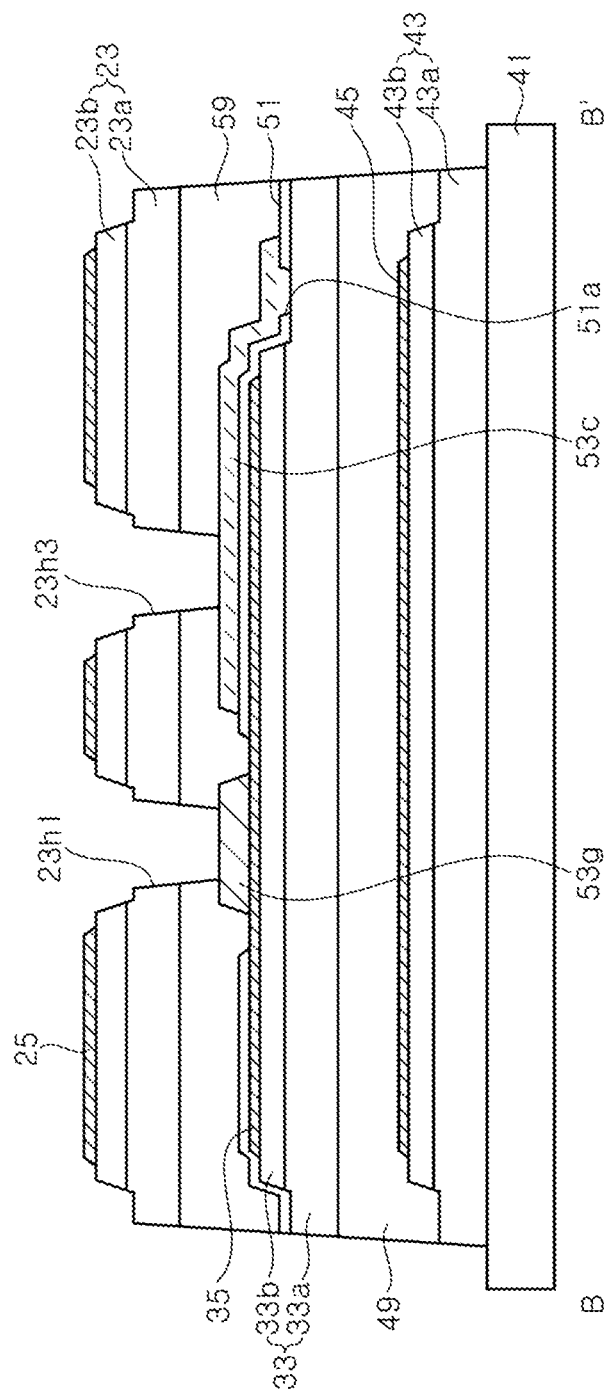
Figure 11D:
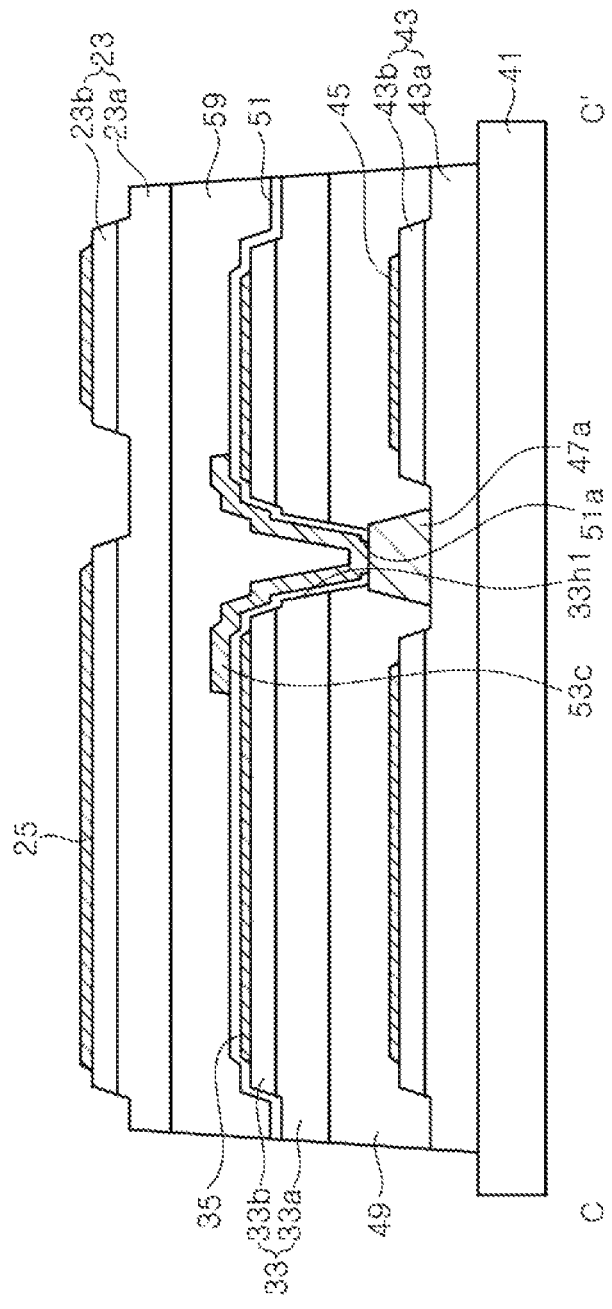
Figure 12A:
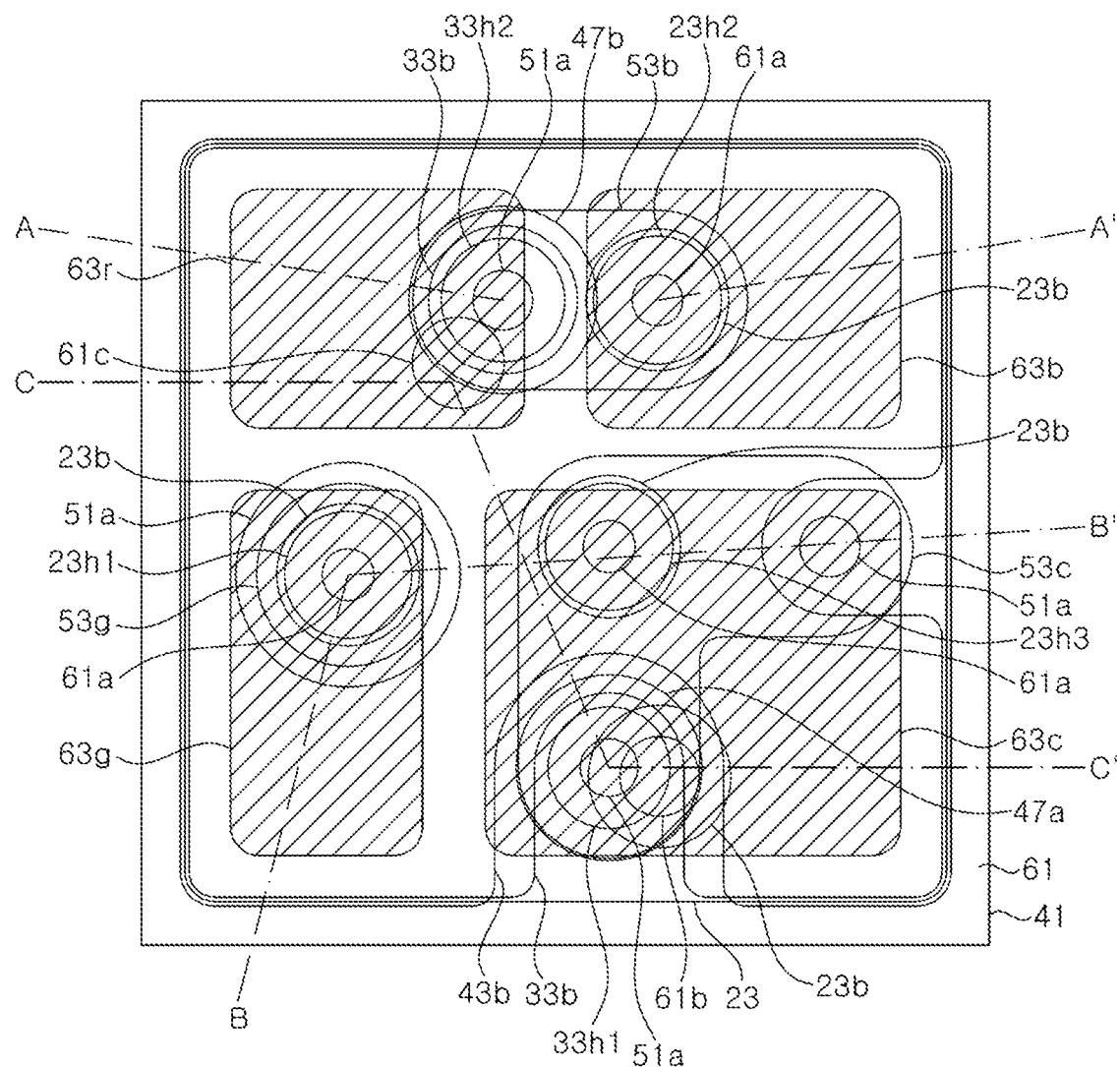
Figure 12B:
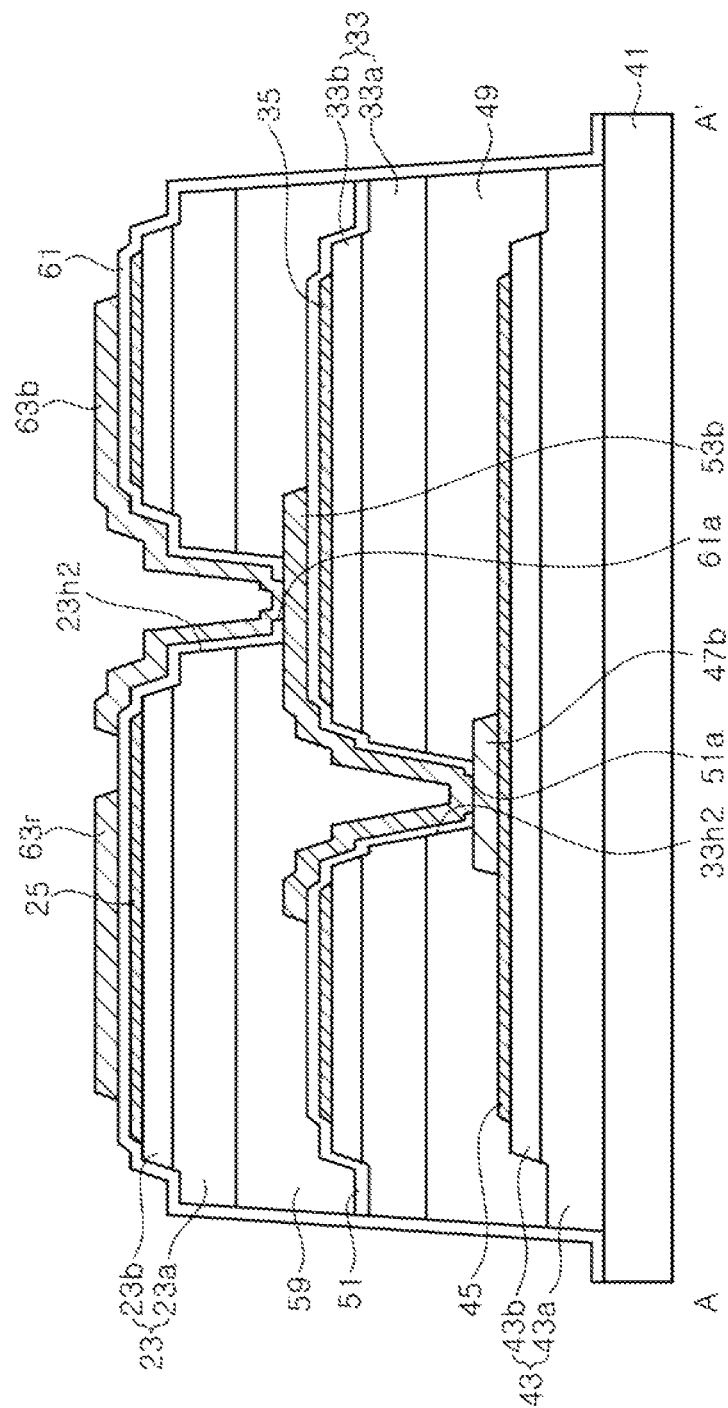
Figure 12C:
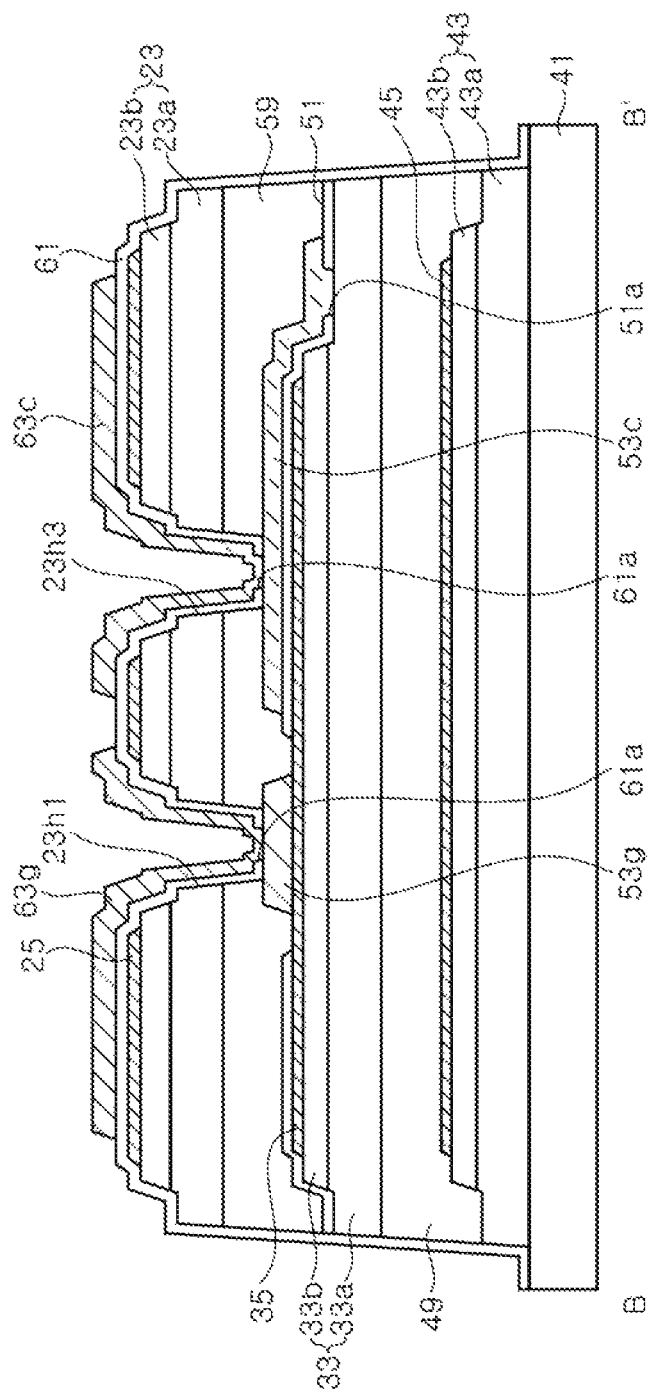
Figure 12D:
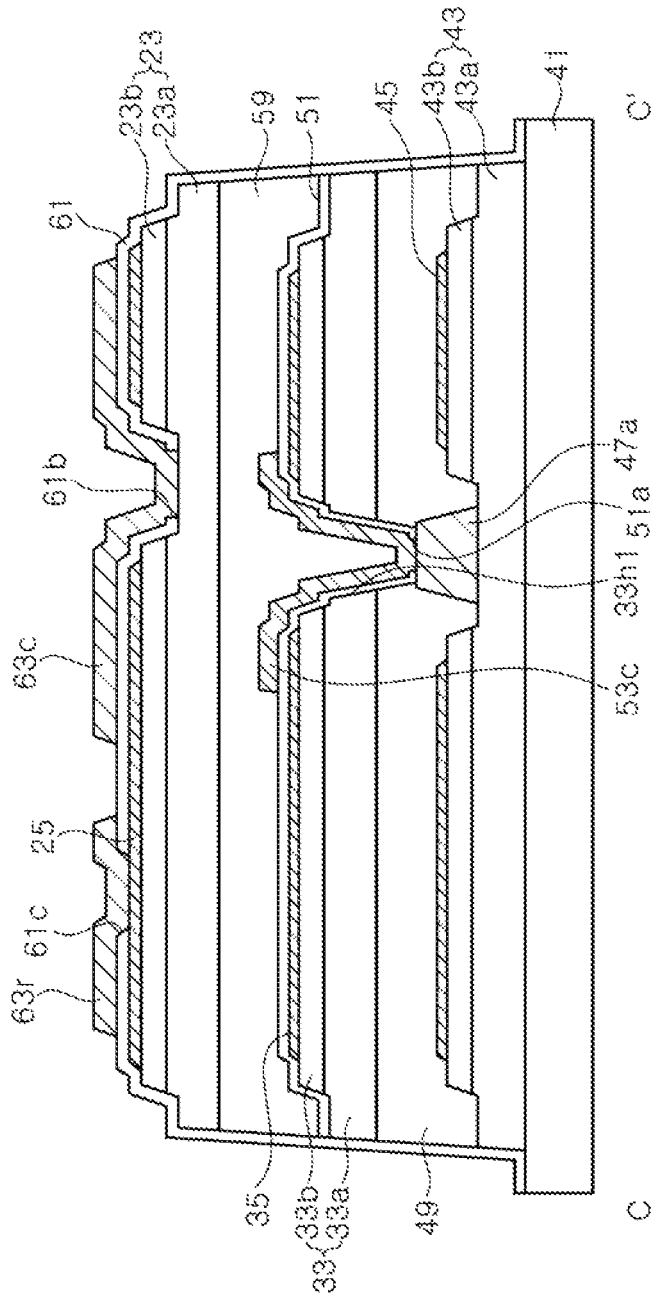

For example, after the etching mask is formed, the first transparent electrode 25 may be etched first by the wet etching technique, and then the second conductivity type semiconductor layer 23b may be etched by the dry etching technique using the same etching mask. Accordingly, the first transparent electrode 25 may be recessed from the mesa etching region. FIG. 9A shows an edge of the mesa and does not show an edge of the first transparent electrode 25 to simplify the drawing. However, since the first transparent electrode 25 is wet etched using the same etching mask, it can be easily understood that the edge of the first transparent electrode 25 will be recessed from the edge of the mesa toward an inner side of the mesa. Since the same etching mask is used, the number of photo processes is not increased, thereby reducing the process cost. However, the present disclosure is not limited thereto, and the etching mask for the mesa etching process and the etching mask for etching the first transparent electrode 25 may be used, respectively.

Referring to FIG. 10A, FIG. 10B, FIG. 10C, and FIG. 10D, upper through-holes 23h1, 23h2, and 23h3 may be formed through the first LED stack 23 using the etching technique. The upper through-holes 23h1, 23h2, and 23h3 pass through the second bonding layer 59 to expose the upper p-electrode pad 53g, the lower p-connector 53b, and the lower common connector 53c, respectively. Regions of the upper p-electrode pad 53g, the lower p-connector 53b, and the lower common connector 53c exposed by the upper through-holes 23h1, 23h2, and 23h3 may be located at the substantially same elevation. Accordingly, the upper through-holes 23*h*1, 23*h*2, and 23*h*3 may have substantially the same depth, and may be formed together in the same process.

The upper through-holes 23*h*1, 23*h*2, and 23*h*3 may be formed in the mesa etching region, and thus, sidewalls of the upper through-holes may have a stepped structure like the lower through-holes 33*h*1 and 33*h*2.

Referring to FIG. 11A, FIG. 11B, FIG. 11C, and FIG. 11D, an isolation trench is formed to define a region of the light emitting device 100 by an isolation process. The isolation trench may expose the third substrate 41 along peripheries of the first to third LED stacks 23, 33, and 43. Between regions of the light emitting device, the isolation trench may be formed by sequentially removing the first LED stack 23, the second bonding layer 59, the lower insulation layer 51, the second LED stack 33, the first bonding layer 49, and the third LED stack 43. The first transparent electrode 25, the second transparent electrode 35, and the third transparent electrode 45 are not exposed during the isolation process, and thus, the first transparent electrode 25, the second transparent electrode 35, and the third transparent electrode 45 may not be damaged by etching gases. When the second and third transparent electrodes 35 and 45 are formed of ZnO, ZnO may be easily damaged by etching gases. However, according to the illustrated exemplary embodiment, the second transparent electrode 35 and the third transparent electrode 45 may be prevented from being exposed to an etching gas by forming the second and third transparent electrodes 35 and 45 to be recessed inwardly.

In the illustrated exemplary embodiment, the first to third LED stacks 23, 33, and 43 are described as being sequentially patterned through the isolation process, but the inventive concepts are not limited thereto. For example, in some exemplary embodiments, the second conductivity type semiconductor layers 23*b*, 33*b*, and 43*b* of the first to third LED stacks 23, 33, and 43 may be removed in the mesa etching process in advance. In addition, the third LED stack 43 may be removed in advance in a region where the isolation trench will be formed before bonding the second LED stack 33, or the second LED stack 33 may be removed in advance in the region in which the isolation trench will be formed before bonding the first LED stack 23. In this case, the region where the third LED stack 43 is removed may be filled with the first bonding layer 49, and the region where the second LED stack 33 is removed may be filled with the second bonding layer 59. Accordingly, the second and third LED stacks 33 and 43 may not be exposed in the isolation process.

Referring to FIG. 12A, FIG. 12B, FIG. 12C, and FIG. 12D, an intermediate insulation layer 61 is formed on the first LED stack 23 and the first transparent electrode 25. The intermediate insulation layer 61 may cover side surfaces of the first to third LED stacks 23, 33, and 43, side surfaces of the first and second bonding layers 49 and 59, and a side surface of the lower insulation layer 51 exposed through the isolation trench.

The intermediate insulation layer 61 may also cover sidewalls of the upper through-holes 23*h*1, 23*h*2, and 23*h*3. However, the intermediate insulation layer 61 is patterned to have openings 61*a* exposing bottoms of the upper through-holes 23*h*1, 23*h*2, and 23*h*3, an opening 61*b* exposing the first conductivity type semiconductor layer 23*a* of the first LED stack 23, and an opening 61*c* exposing first transparent electrode 25. The openings 61*a* expose the upper p-electrode pad 53*g*, the lower p-connector 53*b*, and the lower common connector 53*c* in the upper through-holes 23*h*1, 23*h*2, and 23*h*3.

First to third upper connectors 63*r*, 63*g*, and 63*b* and an upper common connector 63*c* are formed on the intermediate insulation layer 61. The first upper connector 63*r* is connected to the first transparent electrode 25, the second upper connector 63*g* is connected to the upper p-electrode pad 53*g*, and the third upper connector 63*b* is connected to the lower p-connector 53*b*. The upper common connector 63*c* may be connected to the lower common connector 53*c*.

Referring to FIG. 13A, FIG. 13B, FIG. 13C, and FIG. 13D, an upper insulation layer 71 is formed to cover the intermediate insulation layer 61 and the connectors 63*r*, 63*g*, 63*b*, and 63*c*. The upper insulation layer 71 may also cover the intermediate insulation layer 61 on the side surfaces of the first to third LED stacks 23, 33, and 43. However, the upper insulation layer 71 may be patterned to have openings 71*a* exposing the first to third upper connectors 63*r*, 63*g*, and 63*b* and the upper common connector 63*c*.

Subsequently, bump pads 73*r*, 73*g*, 73*b*, and 73*c* are formed in the openings 71*a*, respectively. The first bump pad 73*r* is disposed on the first upper connector 63*r*, the second bump pad 73*g* is disposed on the second upper connector 63*g*, and the third bump pad 73*b* is disposed on the third upper connector 63*b*. The common bump pad 73*c* is disposed on the upper common connector 63*c*.

Then, the light emitting device 100 is bonded onto a circuit board 101 (see FIG. 14), and the third substrate 41 may be separated from the light emitting device 100. A schematic virtual cross-sectional view of the light emitting device 100 bonded to the circuit board 101 is exemplarily shown in FIG. 14.

Figure 14:
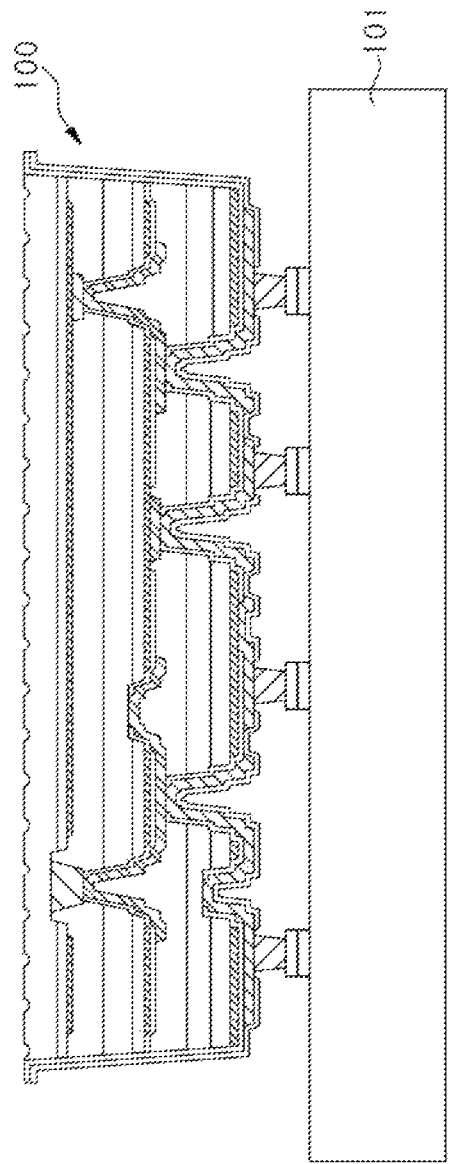
FIG. 14 is a schematic virtual cross-sectional view illustrating a light emitting device mounted on a circuit board according to an exemplary embodiment.

Although FIG. 14 exemplarily illustrates that a single light emitting device 100 is disposed on the circuit board 101, however, a plurality of light emitting devices 100 may be mounted on the circuit board 101. Each of the light emitting devices 100 may form one pixel capable of emitting any one of blue light, green light, and red light, and a plurality of pixels are arranged on the circuit board 101 to provide a display panel.

Figure 15A:
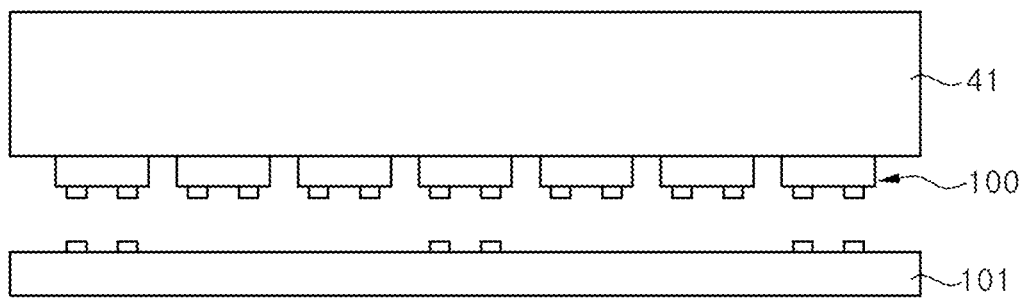
FIG. 15A, FIG. 15B, and FIG. 15C are schematic cross-sectional views illustrating a method of transferring a light emitting device to a circuit board according to an exemplary embodiment.
Figure 15B:
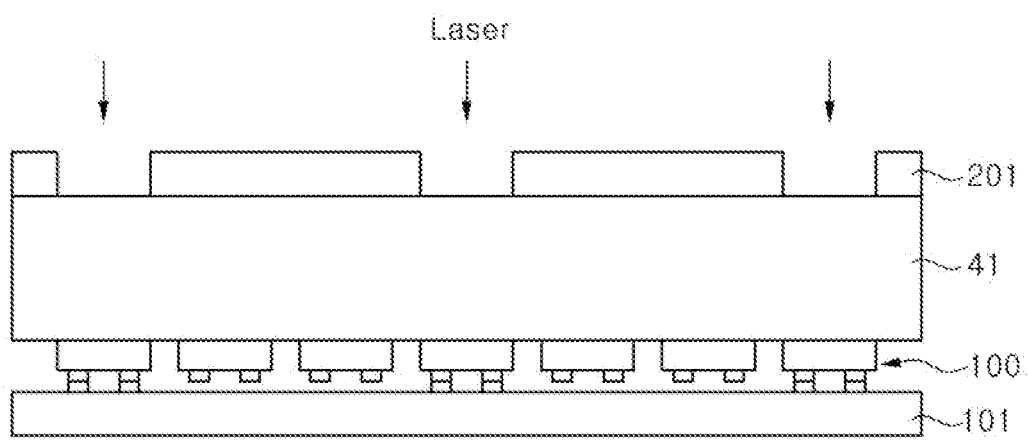
Figure 15C:
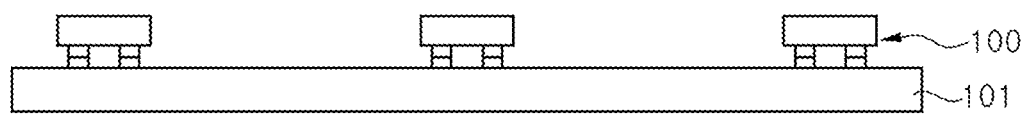

The plurality of light emitting devices 100 may be formed on the substrate 41, and these light emitting devices 100 may be transferred onto the circuit board 101 in a group, rather than individually. FIG. 15A, FIG. 15B, and FIG. 15C are schematic cross-sectional views illustrating a method of transferring the light emitting device to the circuit board according to an exemplary embodiment. Hereinafter, a method of transferring the light emitting devices 100 formed on the substrate 41 to the circuit board 101 in a group will be described.

Figure 13A:
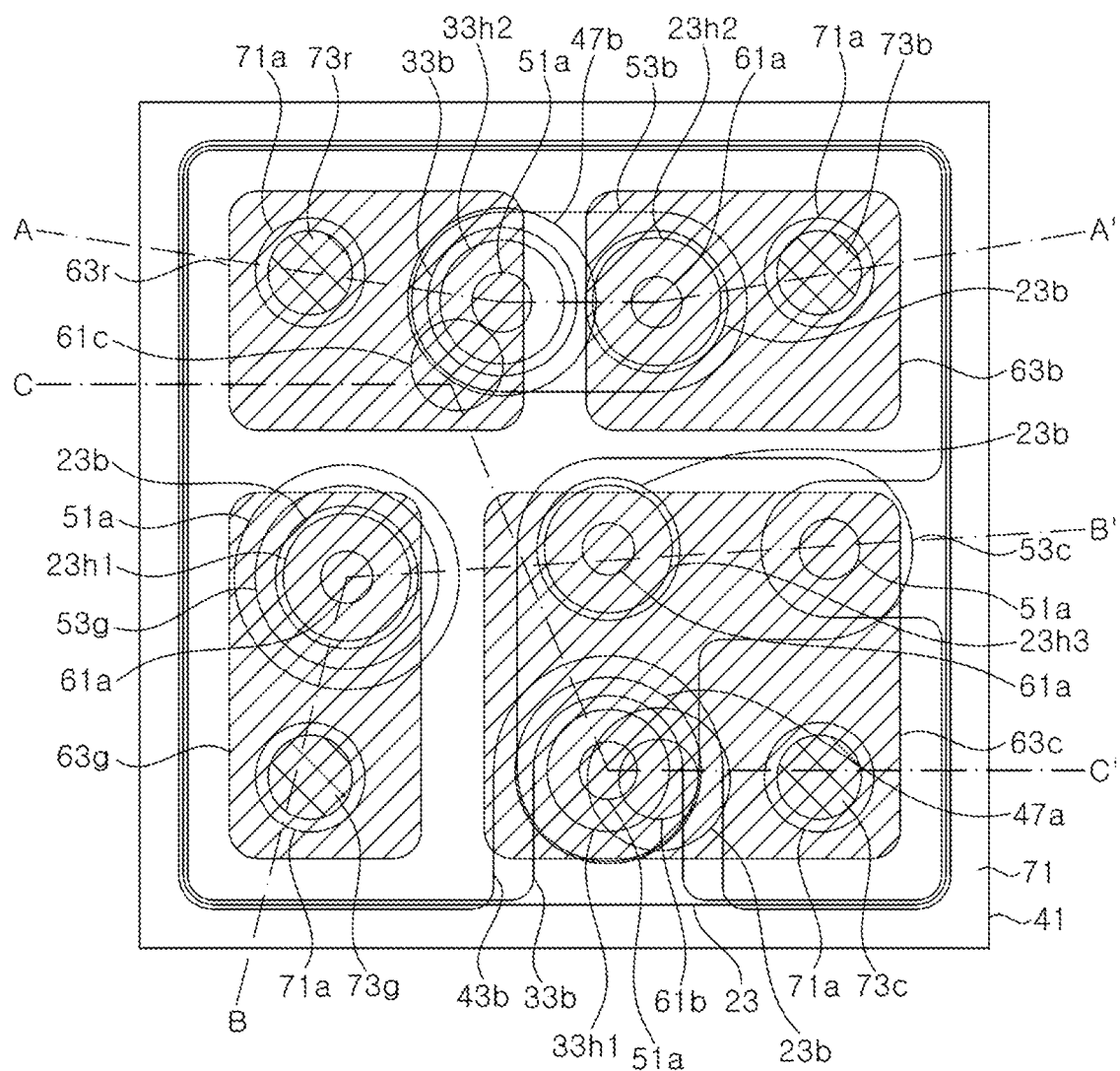
Figure 13B:
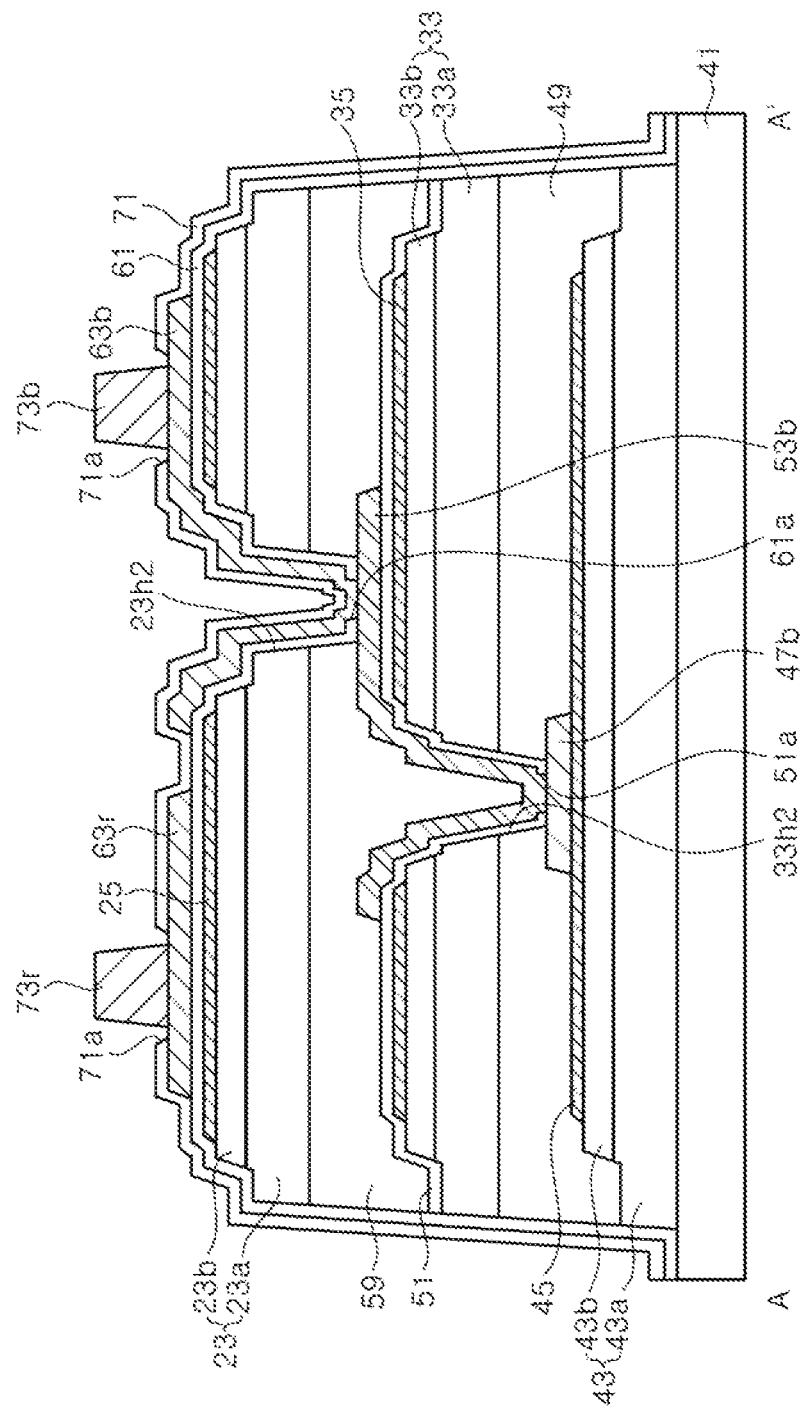
Figure 13C:
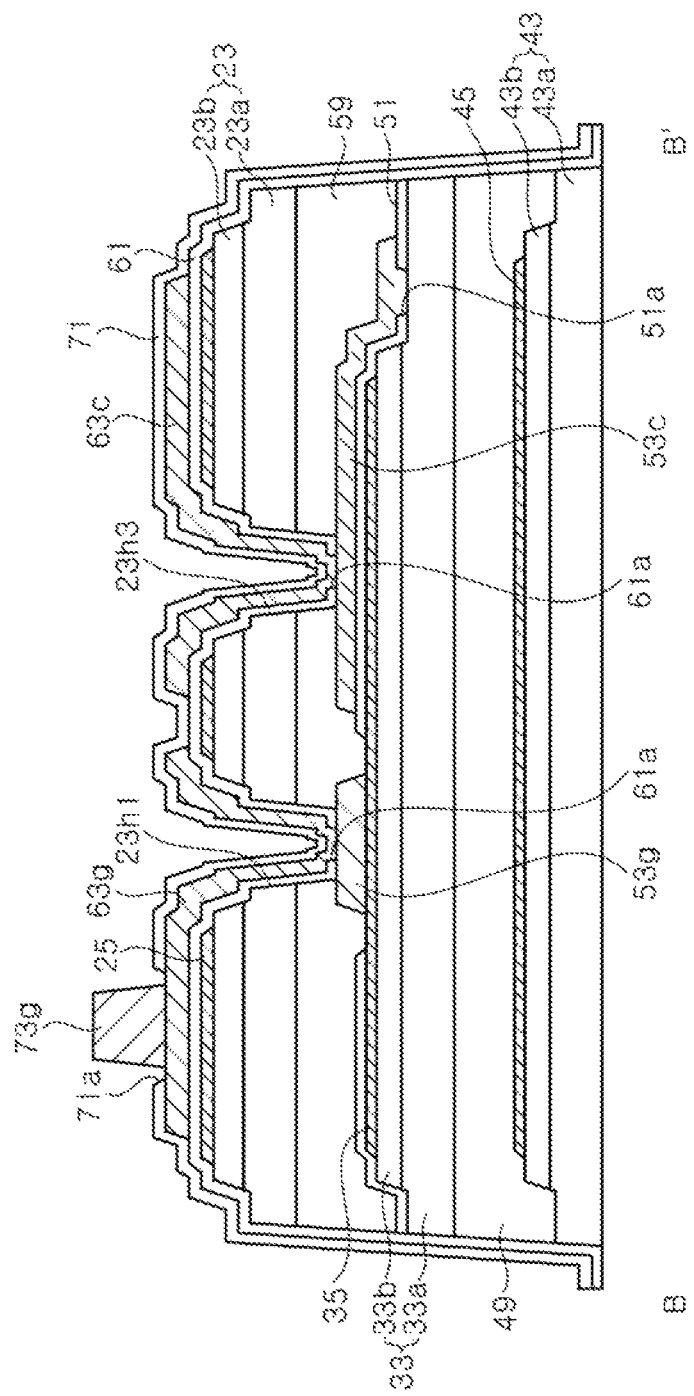
Figure 13D:
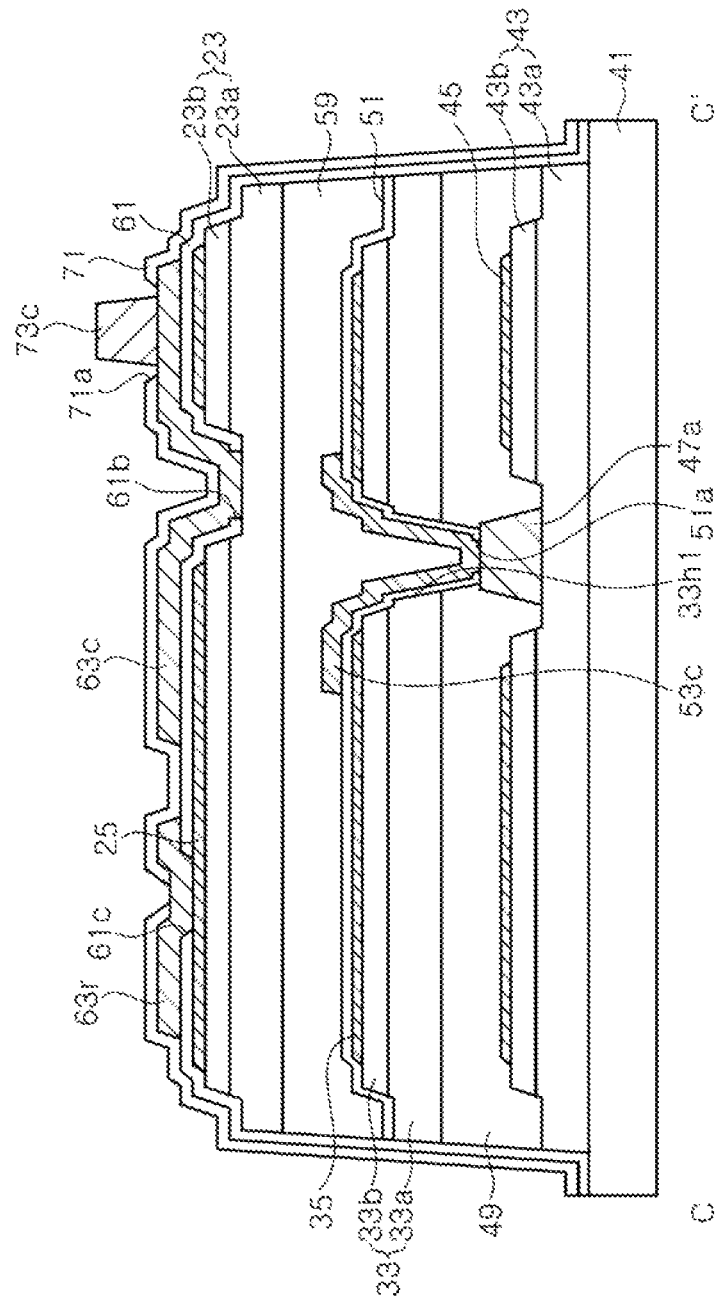

Referring to FIG. 15A, as described above, when the processes of FIG. 13A, FIG. 13B, of FIG. 13C, and FIG. 13D are completed, the plurality of light emitting devices 100 are isolated from each other and are arranged on the substrate 41 by the isolation trench.

Meanwhile, the circuit board 101 having pads on an upper surface thereof is provided. The pads are arranged on the circuit board 101 to correspond to locations where the pixels for a display are to be arranged. In general, an interval between the light emitting devices 100 arranged on the substrate 41 may be less than that of the pixels on the circuit board 101.

Referring to FIG. 15B, the bump pads of the light emitting devices 100 are selectively bonded to the pads on the circuit board 101. The bump pads and the pads may be bonded using In bonding, for example. In this case, the light emitting devices 100 located between pixel regions may be spaced apart from the circuit board 101, since these light emitting devices 100 do not have pads of the circuit board 101 to be boned to.

Subsequently, single or multiple lasers are irradiated onto the substrate 41. For example, a mask 201 may be disposed on the substrate 41, and a light transmitting region may be placed to correspond to the bonded light emitting devices 100. In this manner, the laser may be selectively irradiated to the light emitting devices 100 bonded to the pads. Thereafter, the light emitting devices 100 are transferred to the circuit board 101 by separating the light emitting devices 100 irradiated with the laser from the substrate 41. Accordingly, the display panel including the circuit board 101 on which the light emitting devices 100 are arranged is provided. The display panel may be mounted on various display apparatuses as described with reference to FIG. 1.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of fabricating a light emitting device for a display, comprising:
    growing a first LED stack on a first growth substrate, the first LED stack comprising a first conductivity type semiconductor layer and a second conductivity type semiconductor layer;
    growing a second LED stack on a second growth substrate, the second LED stack comprising a first conductivity type semiconductor layer and a second conductivity type semiconductor layer;
    bonding the second LED stack to a first temporary substrate;
    removing the second growth substrate from the second LED stack;
    bonding the second LED stack to the first LED stack;
    removing the first temporary substrate from the second LED stack;
    forming a transparent electrode on the first LED stack before bonding the second LED stack to the first LED stack; and
    forming a transparent electrode on the second conductivity type semiconductor layer of the second LED stack before bonding the second LED stack to the first temporary substrate.

2. The method of claim 1, wherein the second LED stack is bonded to the first LED stack such that the second conductivity type semiconductor layer of the first LED stack is disposed between the first conductivity type semiconductor layer of the first LED stack and the first conductivity type semiconductor layer of the second LED stack.

3. The method of claim 1, wherein the second LED stack is bonded to the first LED stack with a first bonding layer.

4. The method of claim 1, wherein the second growth substrate is removed from the second LED stack using a laser lift off technique.

5. The method of claim 4, further comprising forming a roughened surface on the first conductivity type semiconductor layer of the second LED stack after the second growth substrate is removed.

6. The method of claim 1, wherein the first temporary substrate is removed from the second LED stack using a laser lift off technique.

7. The method of claim 1, further comprising patterning the second conductivity type semiconductor layer of the first LED stack to expose the first conductivity type semiconductor layer of the first LED stack before bonding the second LED stack to the first LED stack.

8. The method of claim 7, further comprising forming a first electrode pad on the exposed first conductivity type semiconductor layer of the first LED stack before bonding the second LED stack to the first LED stack.

9. The method of claim 8, wherein
    the transparent electrode of the first LED stack is formed on the second conductivity type semiconductor layer of the first LED stack before patterning the second conductivity type semiconductor layer of the first LED stack, and
    the method further comprises:
    patterning the transparent electrode of the first LED stack with the second conductivity type semiconductor layer of the first LED stack using one etching mask; and
    forming a second electrode pad on the transparent electrode of the first LED stack.

10. The method of claim 9, further comprising forming through-holes passing through the second LED stack and exposing the first and second electrode pads.

11. The method of claim 8, further comprising patterning the second conductivity type semiconductor layer of the second LED stack to expose the first conductivity type semiconductor layer of the second LED stack after the first temporary substrate is removed.

12. The method of claim 11, wherein a portion of the exposed first conductivity type semiconductor layer of the second LED stack is disposed over the first electrode pad.

13. The method of claim 11, wherein a portion of the exposed first conductivity type semiconductor layer of the second LED stack overlaps the second conductivity type semiconductor layer of the first LED stack.

14. The method of claim 1, further comprising:
    growing a third LED stack on a third growth substrate, the third LED stack comprising a first conductivity type semiconductor layer and a second conductivity type semiconductor layer;
    bonding the third LED stack to a second temporary substrate;
    removing the third growth substrate from the third LED stack;
    bonding the third LED stack to the second LED stack bonded to the first LED stack; and
    removing the second temporary substrate from the third LED stack.

15. The method of claim 14, wherein the third LED stack is bonded to the second LED stack with a second bonding layer.

16. The method of claim 14, wherein the third growth substrate is removed using a wet or dry etching technique.

17. The method of claim 14, wherein the third LED stack is bonded to the second LED stack such that the second conductivity type semiconductor layer of the second LED stack is disposed between the first conductivity type semiconductor layer of the second LED stack and the first conductivity type semiconductor layer of the third LED stack.

18. The method of claim 14, further comprising patterning the second conductivity type semiconductor layer of the third LED stack to expose the first conductivity type semiconductor layer of the third LED stack after the second temporary substrate is removed.

19. The method of claim 18, further comprising forming through-holes passing through the third LED stack for providing electrical paths to the first LED stack or the second LED stack.

* * * * *